US011462475B2

(12) United States Patent
Baek et al.

(10) Patent No.: US 11,462,475 B2
(45) Date of Patent: Oct. 4, 2022

(54) SEMICONDUCTOR DEVICE WITH STACKED WIRINGS HAVING RESPECTIVE PITCHES AND RATIOS THEREBETWEEN

(71) Applicant: Samsung Electronics Co., Ltd., Suwon-si (KR)

(72) Inventors: Sanghoon Baek, Seoul (KR); Seung Young Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/910,748

(22) Filed: Jun. 24, 2020

(65) Prior Publication Data

US 2021/0175170 A1  Jun. 10, 2021

(30) Foreign Application Priority Data

Dec. 4, 2019  (KR) .......................... 10-2019-0159496

(51) Int. Cl.
| | | |
|---|---|---|
| *H01L 23/528* | (2006.01) | |
| *H01L 27/02* | (2006.01) | |
| *H01L 23/538* | (2006.01) | |
| *H01L 27/118* | (2006.01) | |
| *H01L 21/8238* | (2006.01) | |
| *H01L 21/8234* | (2006.01) | |

(52) U.S. Cl.
CPC .. *H01L 23/5283* (2013.01); *H01L 21/823871* (2013.01); *H01L 23/5286* (2013.01); *H01L 23/5386* (2013.01); *H01L 27/0207* (2013.01); *H01L 21/823475* (2013.01); *H01L 27/11807* (2013.01); *H01L 2027/11862* (2013.01); *H01L 2027/11875* (2013.01); *H01L 2027/11888* (2013.01)

(58) Field of Classification Search
CPC . H01L 23/528; H01L 23/5283; H01L 23/522; H01L 23/5226; H01L 27/0207; H01L 27/11807; H01L 21/823475; H01L 2027/11862; H01L 2027/11875; H01L 2027/11883–11888; H01L 23/5286; H01L 21/823871
See application file for complete search history.

(56) References Cited

U.S. PATENT DOCUMENTS

| | | |
|---|---|---|
| 7,919,819 B2 | 4/2011 | Correale, Jr. |
| 8,775,999 B2 | 7/2014 | Chueh et al. |
| 9,007,095 B2 | 4/2015 | Penzes |

(Continued)

*Primary Examiner* — Younes Boulghassoul
(74) *Attorney, Agent, or Firm* — Harness, Dickey & Pierce, P.L.C.

(57) ABSTRACT

A semiconductor device is provided. The semiconductor device includes a first-direction plurality of wirings extending in a first direction, and a second-direction plurality of wiring extending in a second direction intersecting the first direction. The first-direction plurality of wirings that extend in the first direction includes gate wirings spaced apart from each other in the second direction by a gate pitch, first wirings above the gate wirings spaced apart from each other in the second direction by a first pitch, second wirings above the first wirings spaced apart from each other in the second direction by a second pitch, and third wirings above the second wirings spaced apart from each other in the second direction by a third pitch. A ratio between the gate pitch and the second pitch is 6:5.

18 Claims, 21 Drawing Sheets

FIG. 1

(56) References Cited

U.S. PATENT DOCUMENTS

| | | |
|---|---|---|
| 9,331,016 B2 | 5/2016 | Chen et al. |
| 9,543,193 B2* | 1/2017 | Lu ........................ H01L 23/5283 |
| 9,595,536 B1 | 3/2017 | Haigh |
| 10,283,526 B2 | 5/2019 | Zhu et al. |
| 2016/0329241 A1* | 11/2016 | Lin .................... H01L 21/76816 |
| 2018/0365368 A1 | 12/2018 | Do et al. |
| 2019/0035811 A1 | 1/2019 | Chang et al. |
| 2019/0065656 A1 | 2/2019 | Chakraborty et al. |
| 2019/0206893 A1* | 7/2019 | Liaw ................. H01L 27/11807 |
| 2019/0304900 A1* | 10/2019 | Chen ..................... H01L 23/528 |
| 2020/0135640 A1* | 4/2020 | Sio .................... H01L 21/76816 |

* cited by examiner

FIG. 14

|     | 1  | 2  | 3  | ..... | n  |
|-----|----|----|----|-------|----|
| GP  | g  | g  | g  | ..... | g  |
| P2  | a1 | a2 | a3 | ..... | an |
| P4  | b1 | b2 | b3 | ..... | bn |
| P6  | c1 | c2 | c3 | ..... | cn |
| LCM | M1 | M2 | M3 | ..... | Mn |

FIG. 15

|     | 1  | 2  | 3  | ..... | n  |
|-----|----|----|----|-------|----|
| P1  | l  | l  | l  | ..... | l  |
| P3  | d1 | d2 | d3 | ..... | dn |
| P5  | e1 | e2 | e3 | ..... | en |
| P7  | f1 | f2 | f3 | ..... | fn |
| LCM | L1 | L2 | L3 | ..... | Ln |

SEMICONDUCTOR DEVICE WITH STACKED WIRINGS HAVING RESPECTIVE PITCHES AND RATIOS THEREBETWEEN

This application claims priority under 35 U.S.C. 119 from Korean Patent Application No. 10-2019-0159496 filed on Dec. 4, 2019 in the Korean Intellectual Property Office, the disclosure of which is incorporated herein by reference in its entirety.

BACKGROUND

Example embodiments relate, in general, to a semiconductor device.

Due to characteristics such as miniaturization, multi-functionality and/or low manufacturing cost, semiconductor devices have been spotlighted as an important factor in the electronics industry. The semiconductor devices may be classified into a semiconductor memory device that stores (logical) data, a semiconductor logical device that performs arithmetic processing on logical data, a hybrid semiconductor device that includes a storage element and a logical element, and/or the like.

As the electronics industry is highly developed, demands and/or desires for improved characteristics of semiconductor devices gradually increase. For example, demands for high reliability, high speed, and/or multi-function of the semiconductor devices gradually increase. In order to satisfy such required characteristics, structures in the semiconductor device become gradually complicated and highly integrated.

As the structures are complicated, layout of the wirings in the semiconductor device becomes important. One reason may be that, when wirings are efficiently placed, many wirings may be placed in a limited area.

SUMMARY

Aspects of the example embodiments provide a semiconductor device having an improved wiring density.

However, aspects of example embodiments are not restricted to the one set forth herein. The above and other aspects of some example embodiments will become more apparent to one of ordinary skill in the art to which some example embodiments pertains by referencing the detailed description of some example embodiments given below.

According to some example embodiments, there is provided a semiconductor device comprising a first-direction plurality of wirings extending in a first direction, and a second-direction plurality of wiring extending in a second direction intersecting the first direction. The first-direction plurality of wirings that extend in the first direction includes gate wirings spaced apart from each other in the second direction by a gate pitch, first wirings above the gate wirings spaced apart from each other in the second direction by a first pitch, second wirings above the first wirings spaced apart from each other in the second direction by a second pitch, and third wirings above the second wirings spaced apart from each other in the second direction by a third pitch. A ratio between the gate pitch and the second pitch is 6:5.

According to some example embodiments, there is provided a semiconductor device comprising a first-direction plurality of wirings extending in a first direction, and a second-direction plurality of wirings extending in a second direction intersecting the first direction. The second-direction plurality of wirings that extend in the second direction includes fourth wirings spaced apart from each other in the first direction by a fourth pitch, fifth wirings above the fourth wirings spaced apart from each other in the first direction by a fifth pitch, sixth wirings above the fifth wirings spaced apart from each other in the first direction by a sixth pitch, and seventh wirings above the sixth wirings spaced apart from each other in the first direction by a seventh pitch. A ratio between the fourth pitch and the fifth pitch is 5:4.

According to some example embodiments, there is provided a semiconductor device comprising a first-direction plurality of wirings extending in a first direction, and a second-direction plurality of wirings extending in a second direction that intersects the first direction. The first-direction plurality of wirings includes gate wirings spaced apart from each other in the second direction by a gate pitch, and first wirings above the gate wirings spaced apart from each other in the second direction by a first pitch. The second direction plurality of wirings includes fourth wirings above the gate wirings and below the first wirings and spaced apart from each other in the first direction by a fourth pitch, and fifth wirings above the first wirings and spaced apart from each other in the first direction by a fifth pitch. A ratio between the gate pitch and the first pitch is 6:4, and a ratio between the fourth pitch and the fifth pitch is 5:4.

BRIEF DESCRIPTION OF THE DRAWINGS

The above and other aspects and features of the present invention will become more apparent by describing in detail exemplary embodiments thereof with reference to the attached drawings, in which:

FIGS. 14 and 15 are diagrams showing a process of determining a wiring pitch of a semiconductor device according to some example embodiments;

DETAILED DESCRIPTION OF EXAMPLE EMBODIMENTS

Some example embodiments will be described below with reference to the attached drawings.

Figure 1:
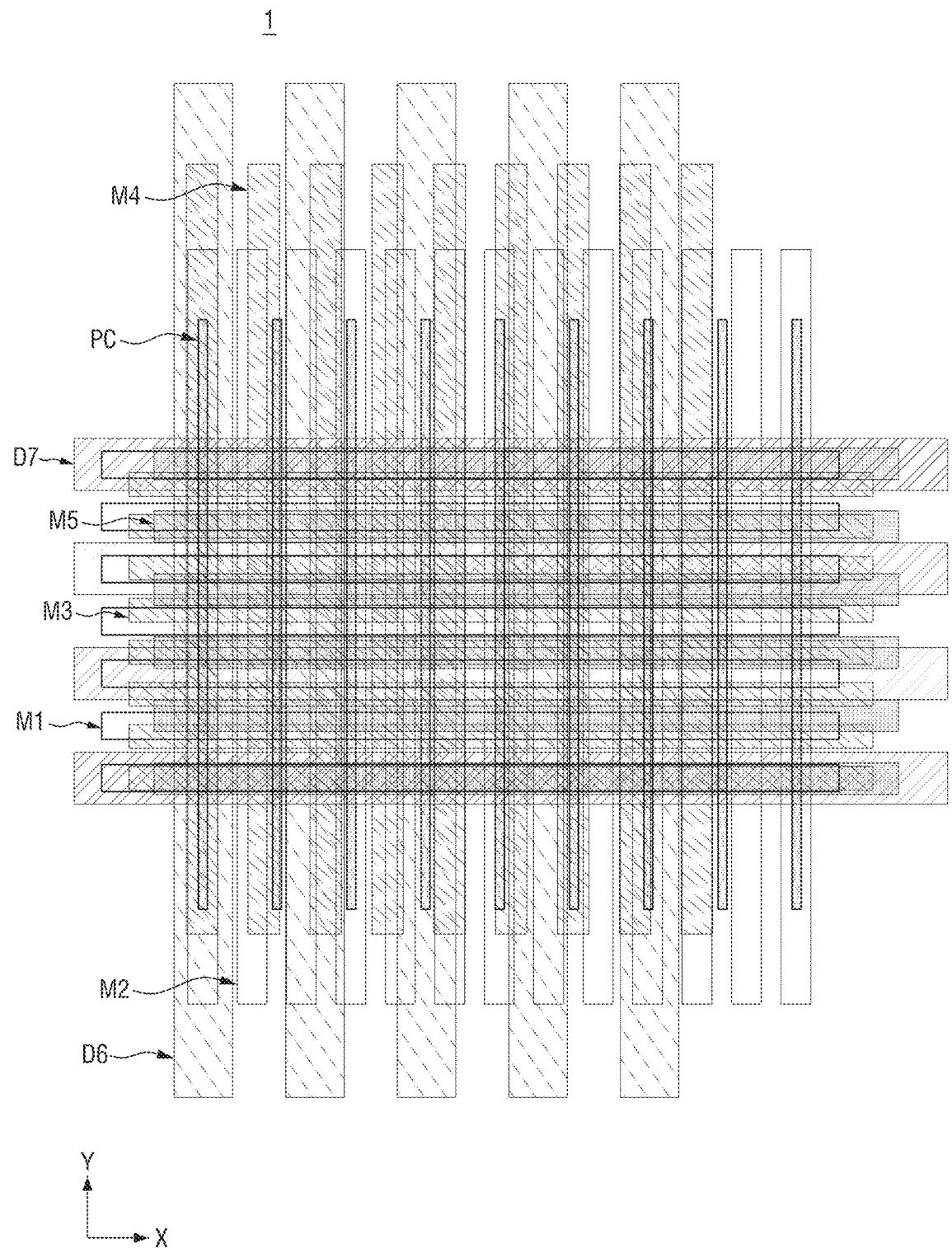
FIG. 1 is a wiring layout of a semiconductor device according to some example embodiments.

FIG. 1 is a wiring layout of a semiconductor device according to some embodiments.

Referring to FIG. 1, a semiconductor device 1 may include a plurality of wirings PC, M2, M4 and D6 that each extend in a first direction (e.g., a Y direction, hereinafter Y), and a plurality of wirings M1, M3, M5 and D7 that each extend in a second direction (e.g., a X direction, hereinafter X). The first direction Y and the second direction X may intersect with one another. For example, the first direction Y may be perpendicular to the second direction X.

Although it is not shown in detail in FIG. 1, such a plurality of wirings PC, M2, M4, D6, M1, M3, M5 and D7 may be used to provide, for example, a voltage and/or a signal to a functional component, such as a bipolar and/or MOSFET N-type and/or P-type transistor and/or a capacitor placed in the semiconductor device 1. Accordingly, the plurality of wirings PC, M2, M4, D6, M1, M3, M5 and D7 may be placed between the plurality of functional components and a plurality of conductive contacts and/or vias associated with the transistors/capacitors/etc.

In the semiconductor device 1 according to some example embodiments, the wirings PC, M2, M4 and D6 extending in the first direction Y may be placed such that pitches of each of the wirings PC, M2, M4 and D6 have a constant relationship with each other. In addition, the plurality of wirings M1, M3, M5 and D7 extending in the second direction X may be placed such that pitches of each of the wiring M1, M3, M5 and D7 have a constant relationship with each other. Herein, pitches may refer to center-to-center distances of neighboring wirings.

Hereinafter, the relationship between the wirings PC, M2, M4 and D6 extending in the first direction Y will be described first with reference to FIGS. 2 to 7.

Figure 2:
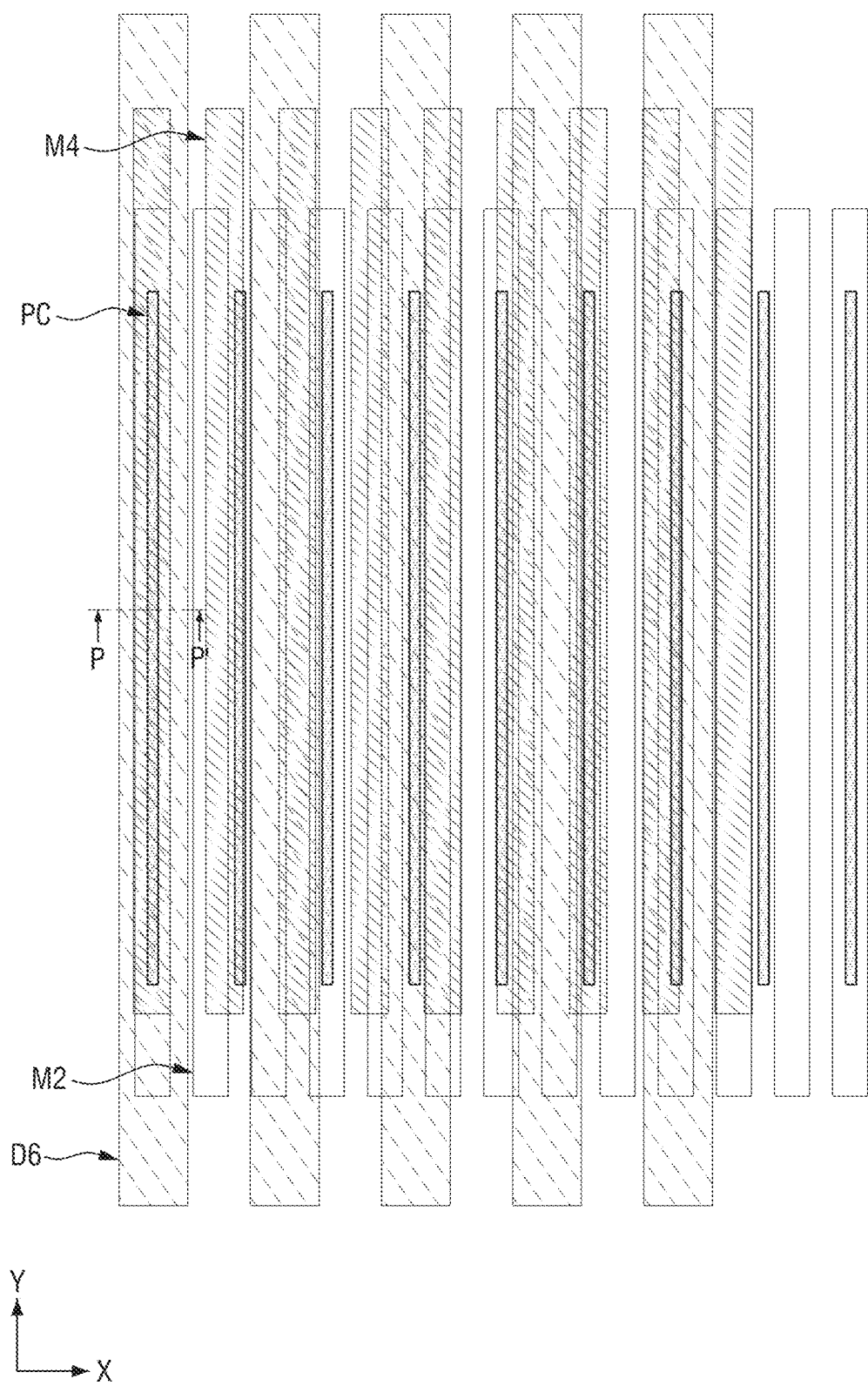
FIG. 2 is a layout separately showing wirings extending in a Y direction among the wirings of FIG. 1.
Figure 3:
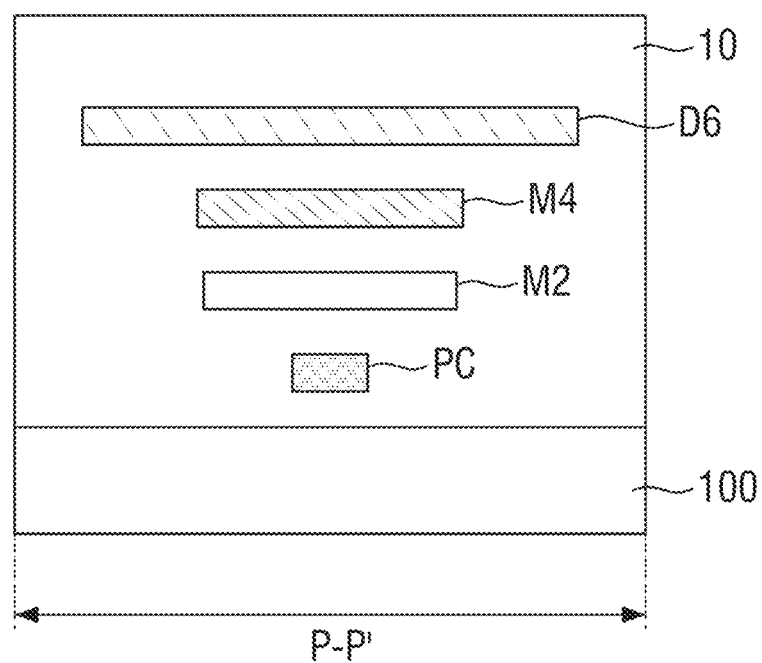
FIG. 3 is a cross-sectional view taken along a line P-P' of FIG. 1.
Figure 3:
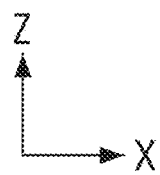
Figure 4:
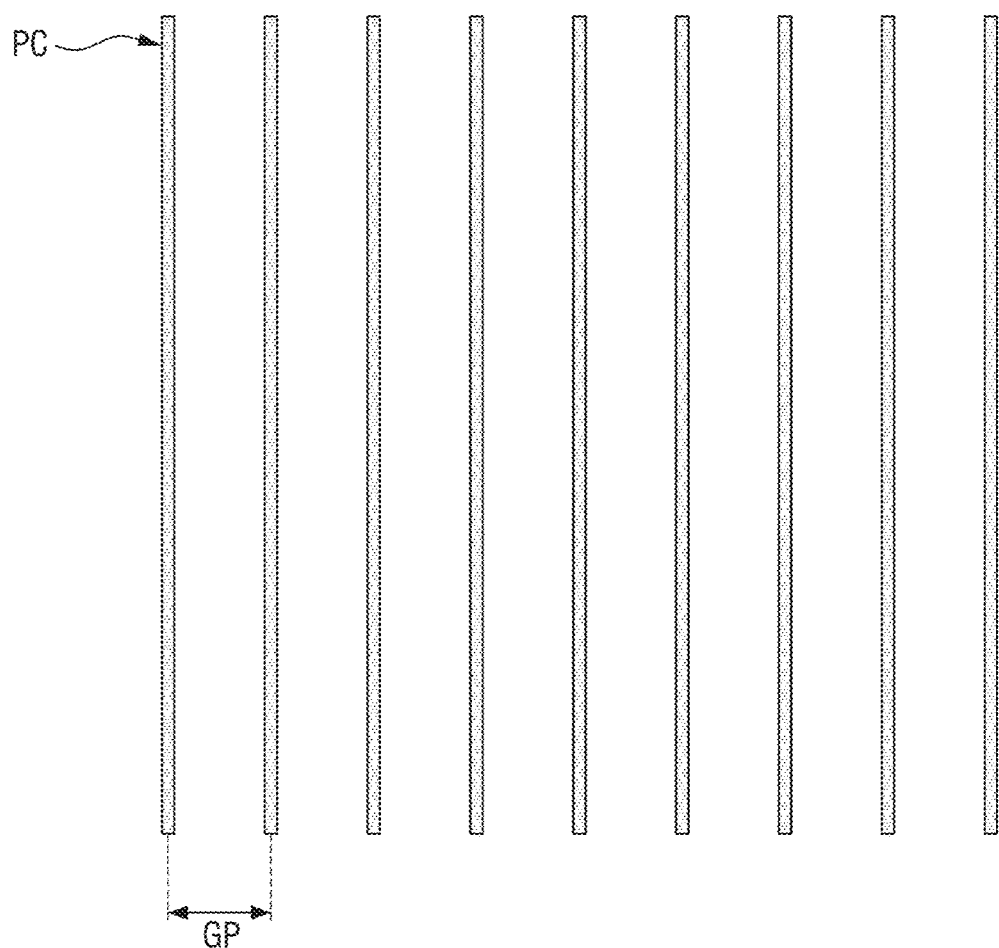
FIG. 4 is a layout separately showing a gate wiring of FIG. 2.
Figure 5:
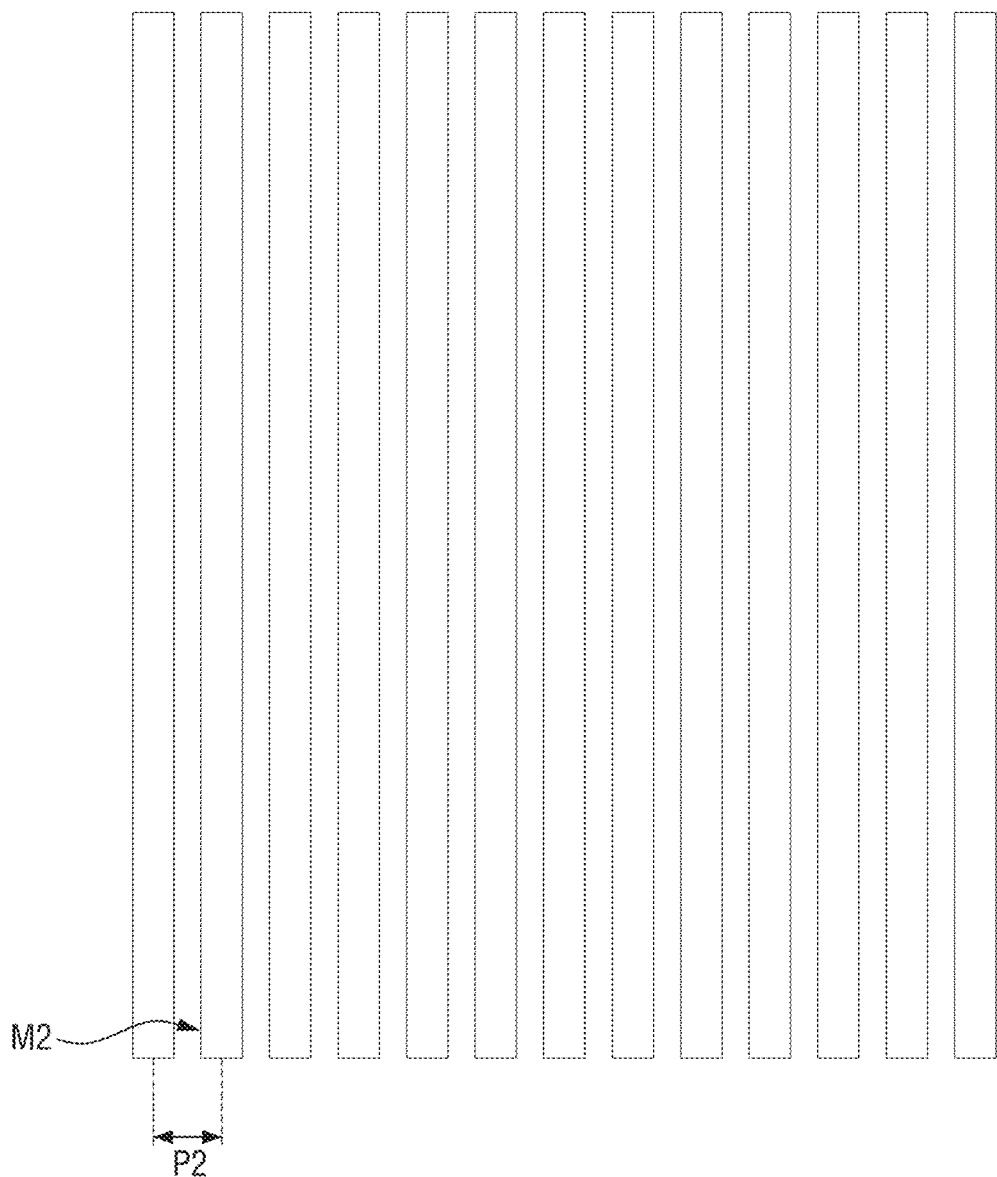
FIG. 5 is a layout separately showing a M2 wiring of FIG. 2.
Figure 6:
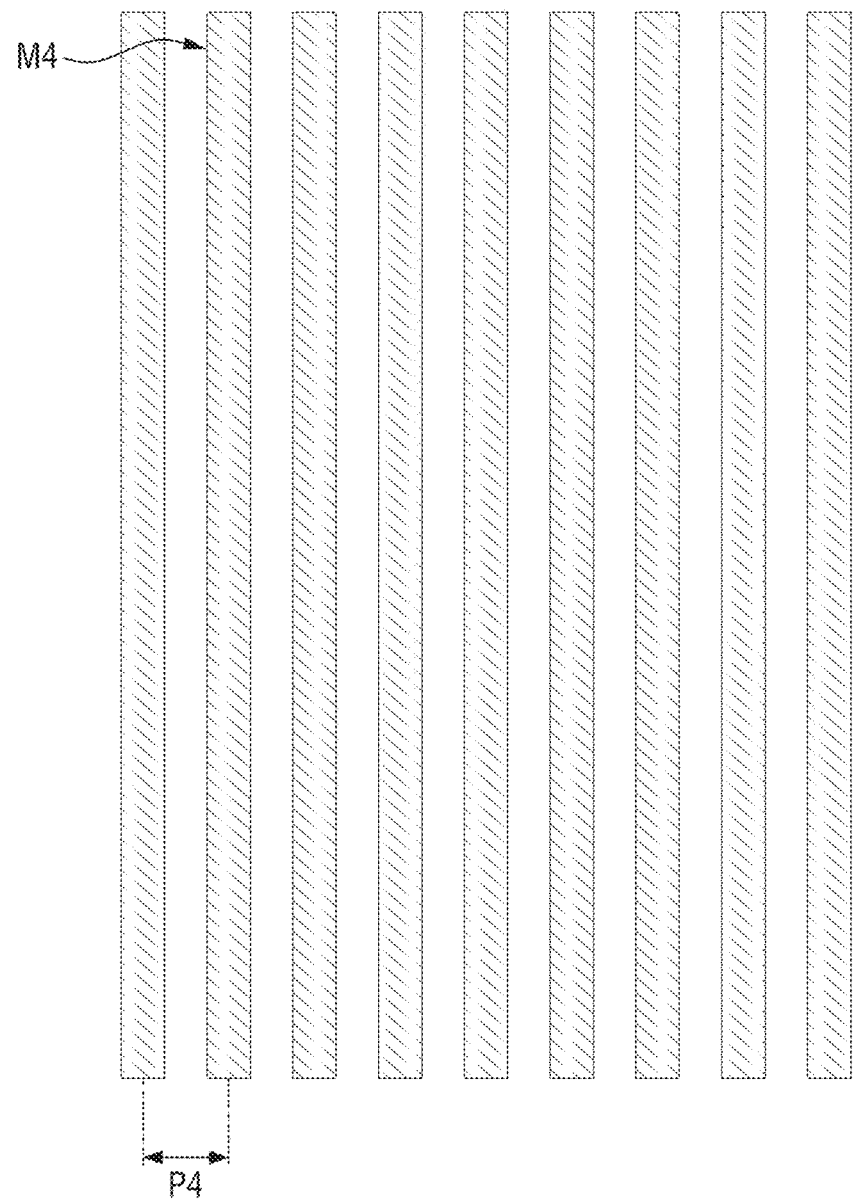
FIG. 6 is a layout separately showing a M4 wiring of FIG. 2.
Figure 7:
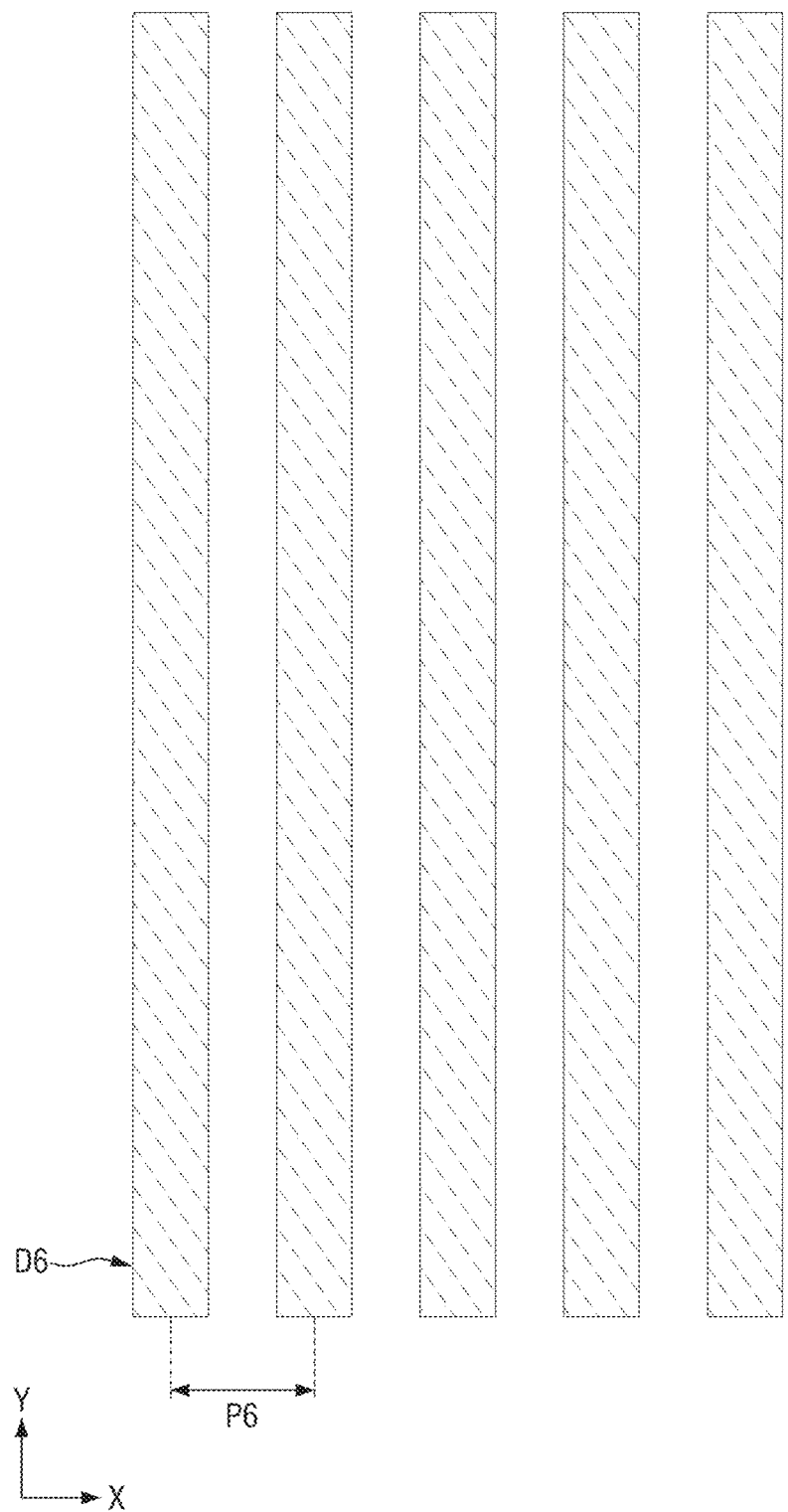
FIG. 7 is a layout separately showing a D6 wiring of FIG. 2.

FIG. 2 is a layout separately showing wirings extending in the Y direction among the wirings of FIG. 1. FIG. 3 is a cross-sectional view taken along a line P-P' of FIG. 2. FIG. 4 is a layout separately showing the gate wirings of FIG. 2. FIG. 5 is a layout separately showing an M2 wiring of FIG. 2. FIG. 6 is a layout separately showing an M4 wiring of FIG. 2. FIG. 7 is a layout separately showing a D6 wiring of FIG. 2.

Referring to FIGS. 2 to 7, the wirings PC, M2, M4 and D6 extending in the first direction Y may include a gate wiring PC, a first wiring M2, a second wiring, M4 and a third wiring D6.

The gate wiring PC may be placed below the first wiring M2. The gate wiring PC may be placed on/above the substrate 100, and the first wiring M2 may be placed on the gate wiring PC. In FIGS. 2 to 7, although other components (e.g., transistors, vias, conductive contacts and/or the like) placed in the semiconductor device are not shown to more easily explain the relationship between the wirings PC, M2, M4 and D6, for example, the gate wiring PC may be electrically connected to a gate electrode of a transistor and/or used as a gate electrode of the transistor. Each of the wirings PC, M2, M4, and D6 may include a conductivity material. For example, the gate wiring PC may include a conductive material such as doped and/or undoped polysilicon and/or a metal such as tungsten. The wirings M2, M4, and D6 may include material such as aluminum and/or copper.

A width of the first wiring M2 placed above the gate wiring PC may be greater than a width of the gate wiring PC.

The second wiring M4 may be placed on the first wiring M2. In some example embodiments, although the width of the second wiring M4 may be substantially the same as the width of the first wiring M2, example embodiments are not limited thereto, and the width of the first wiring M2 may be greater than and/or less than the width of the second wiring M4.

The third wiring D6 may be placed on the second wiring M4. In some example embodiments, although the width of the third wiring D6 may be wider than the widths of the gate wiring PC, the first wiring M2, and the second wiring M4, example embodiments are not limited thereto.

The gate wiring PC, the first wiring M2, the second wiring M4, and the third wiring D6 may be insulated from each other by the interlayer insulating film 10. The interlayer insulating film 10 may include a plurality of layers, and may include an insulator such as a silicon-oxide insulator; however, example embodiments are not limited thereto.

Referring to FIG. 4, the gate wirings PC may be spaced apart from each other by a gate pitch GP and extend in the first direction Y. The gate wirings PC may be spaced apart from each other by the gate pitch GP in the second direction X and extend in the first direction Y side by side. For example, a center of each of the gate wirings PC may be spaced apart from each other in the second direction X by the gate pitch GP. Alternatively or additionally, a left edge (resp. a right edge) of each of the gate wirings PC may be spaced apart from a left edge (resp. right edge) of a neighboring gate wiring PC by the gate pitch GP.

Referring to FIG. 5, the first wirings M2 may be spaced apart from each other by a first pitch P2 and extend in the first direction Y. The first wirings M2 may be spaced apart from each other by the first pitch P2 in the second direction X and extend in the first direction Y side by side. For example, a center of each of the first wirings M2 may be spaced apart from each other in the second direction X by the first pitch P2. Alternatively or additionally, a left edge (resp. a right edge) of each of the first wirings M2 may be spaced apart from a left edge (resp. right edge) of a neighboring first wiring M2 by the first pitch P2.

Referring to FIG. 6, the second wirings M4 may be spaced apart from each other by a second pitch P4 and extend in the first direction Y. The second wirings M4 may be spaced apart from each other by the second pitch P4 in the second direction X and extend in the first direction Y side by side. For example, a center of each of the second wirings M4 may be spaced apart from each other in the second direction X by the second pitch P4. Alternatively or additionally, a left edge (resp. a right edge) of each of the second wirings M4 may be spaced apart from a left edge (resp. right edge) of a neighboring second wiring M4 by the second pitch P4.

Referring to FIG. 7, the third wirings D6 may be spaced apart from each other by a third pitch P6 and may extend in the first direction Y. The third wirings D6 may be spaced apart from each other by the third pitch P6 in the second direction X and extend in the first direction Y side by side. For example, a center of each of the third wirings D6 may be spaced apart from each other in the second direction by the third pitch P6. Alternatively or additionally, a left edge (resp. a right edge) of each of the third wirings D4 may be spaced apart from a left edge (resp. right edge) of a neighboring third wiring D4 by the third pitch P6

In some example embodiment, a ratio, e.g. a gear ratio, between the gate pitch GP of the gate wiring PC and the first pitch P2 of the first wiring M2 satisfies 6:4. For example, the gate pitch GP is greater than the first pitch P2. Here, the ratio of 6:4 is a numerical value excluding a process error generated in a fabrication/manufacturing process of the gate wiring PC and the first wiring M2. Therefore, although the ratio may be slightly changed to 6.01:4, 6:3.99, etc. depending on the actual manufacturing process of the gate wiring PC and the first wiring M2, such numerical values may be considered that the ratio is designed and manufactured to 6:4 in accordance with the technical idea of example embodiments.

All of the ratios described below should be understood as numerical values that may not necessarily reflect small differences in fabrication/process conditions that may occur in the actual fabrication/manufacturing processes.

Further, in some example embodiments, a ratio, e.g. a gear ratio between the gate pitch GP of the gate wiring PC, the first pitch P2 of the first wiring M2, and the second pitch P4 of the second wiring M4 is/satisfies 6:4:5. The second pitch P4 may be greater than the first pitch P2, and may be less than the gate pitch GP.

Further, in some example embodiments, a ratio, e.g. a gear ratio between the gate pitch GP of the gate wiring PC, the first pitch P2 of the first wiring M2, the second pitch P4 of the second wiring M4 and the third pitch P6 of the third wiring D6 is/satisfies 6:4:5:9. The third pitch P6 may be greater than the gate pitch GP, the first pitch P2, and the second pitch P4.

In some example embodiments, a ratio, e.g. a gear ratio between the gate pitch GP of the gate wiring PC and the second pitch P4 of the second wiring M4 satisfies 6:5.

In some example embodiments, a ratio, e.g. a gear ratio between the gate pitch GP of the gate wiring PC, the second pitch P4 of the second wiring M4, and the third pitch P6 of the third wiring D6 is/satisfies 6:5:9.

In some example embodiments, a ratio, e.g. a gear ratio between the gate pitch GP of the gate wiring PC and the third pitch P6 of the third wiring D6 satisfies 6:9.

In some example embodiments, a ratio, e.g. a gear ratio between the first pitch P2 of the first wiring M2 and the second pitch P4 of the second wiring M4 satisfies 4:5.

In some example embodiments, a ratio, e.g. a gear ratio between the first pitch P2 of the first wiring M2, the second pitch P4 of the second wiring M4, and the third pitch P6 of the third wiring D6 satisfies 4:5:9.

In some example embodiments, a ratio, e.g. a gear ratio between the second pitch P4 of the second wiring M4 and the third pitch P6 of the third wiring D6 satisfies 5:9.

On the other hand, any combination of ratios not described above in which the ratio between the gate pitch GP of the gate wiring PC, the first pitch P2 of the first wiring M2, the second pitch P4 of the second wiring M4 and the third pitch P6 of the third wiring D6 satisfies 6:4:5:9 may also be implemented according to example embodiments.

The relationship between the wirings M1, M3, M5 and D7 extending in the second direction X will be described below with reference to FIGS. 8 to 13.

Figure 8:
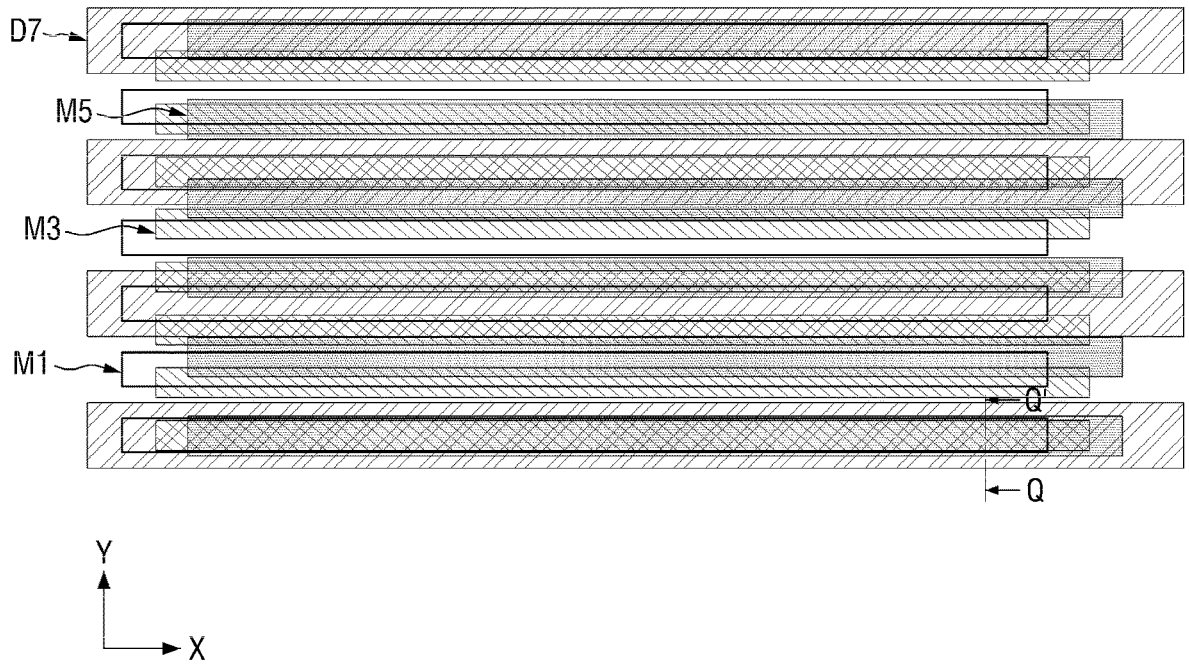
FIG. 8 is a layout separately showing wirings extending in a X direction among the wirings of FIG. 1.
Figure 9:
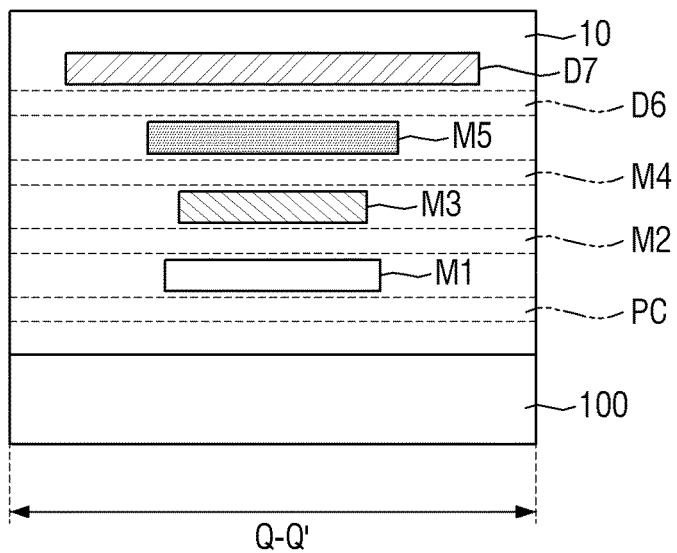
FIG. 9 is a cross-sectional view taken along a line Q-Q' of FIG. 8.
Figure 10:
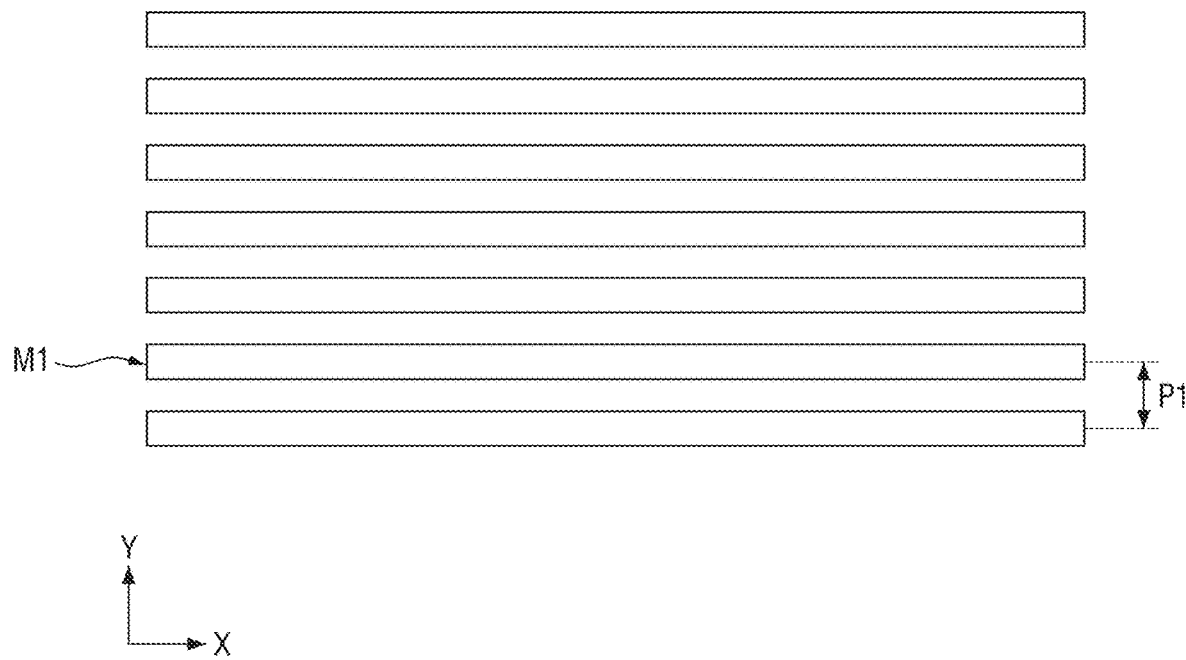
FIG. 10 is a layout separately showing a M1 wiring of FIG. 8.
Figure 11:
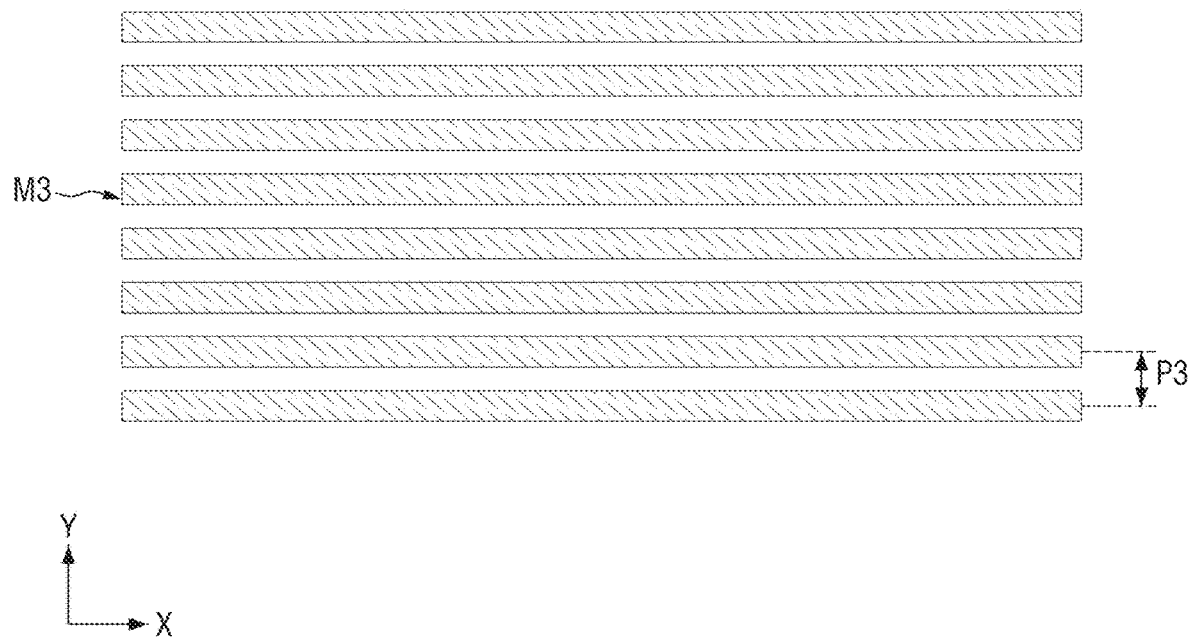
FIG. 11 is a layout separately showing a M3 wiring of FIG. 8.
Figure 12:
FIG. 12 is a layout separately showing a M5 wiring of FIG. 8.
Figure 13:
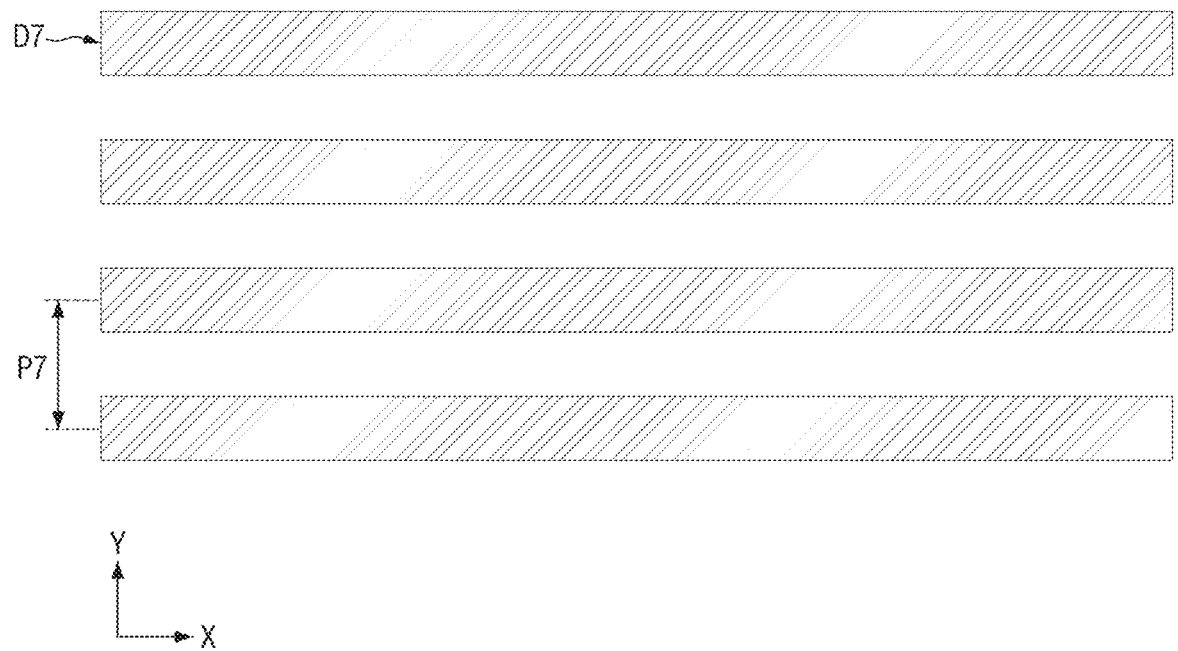
FIG. 13 is a layout separately showing a D7 wiring of FIG. 8.

FIG. 8 is a layout separately showing wirings extending in the X direction among the wirings of FIG. 1. FIG. 9 is a cross-sectional view taken along a line Q-Q' of FIG. 8. FIG. 10 is a layout separately showing the M1 wiring of FIG. 8. FIG. 11 is a layout separately showing the M3 wiring of FIG. 8. FIG. 12 is a layout separately showing the M5 wiring of FIG. 8. FIG. 13 is a layout separately showing the D7 wiring of FIG. 8.

Referring to FIGS. 8 to 13, the wirings M1, M3, M5 and D7 extending in the second direction X may include a fourth wiring M1, a fifth wiring M3, a sixth wiring M5 and a seventh wiring D7.

Although the fourth wiring M1 differs in an extending direction from the gate wiring PC, the fourth wiring M1 may be placed on/above the gate wiring PC. There may be a contact and/or a via (not shown) connecting at least one of the fourth wiring M1 to at least one of the gate wiring PC; however, example embodiments are not limited thereto. FIG. 9 also conceptually shows the wirings PC, M2, M4 and D6 extending in the first direction Y to explain a height relationship between the wirings M1, M3, M5 and D7 extending in the second direction X and the wirings PC, M2, M4 and D6 extending in the first direction Y.

Similarly, although FIGS. 8 to 13 do not show other components (e.g., transistors, vias, conductive contacts, etc.) placed in the semiconductor device to more easily explain the relationship between the wirings M1, M3, M5 and D7, for example, the fourth wiring M1 may be used as a wiring which electrically connects a drain of a first transistor and a source of a second transistor to each other.

The fifth wiring M3 may be placed on the fourth wiring M1. Further, although the fifth wiring M3 differs in the extending direction from the first wiring M2, the fifth wiring M3 may be placed on the first wiring M2. There may be a contact and/or a via (not shown) connecting at least one of the fifth wiring M3 to at least one of the first wiring M2; however, example embodiments are not limited thereto. In some example embodiments, although the width of the fifth wiring M3 may be narrower than the width of the fourth wiring M1, example embodiments are not limited thereto.

The sixth wiring M5 may be placed on the fifth wiring M3. Further, the sixth wiring M5 differs in the extending direction from the second wiring M4, the sixth wiring M5 may be placed on the second wiring M4. There may be a contact and/or a via (not shown) connecting at least one of the sixth wiring M5 to at least one of the second wiring M4; however, example embodiments are not limited thereto. In some example embodiments, although the width of the sixth wiring M5 may be wider than the widths of the fourth wiring M1 and the fifth wiring M3, example embodiments are not limited thereto.

The seventh wiring D7 may be placed on the sixth wiring M5. Further, although the seventh wiring D7 differs in the extending direction from the third wiring D6, the seventh wiring D7 may be placed on the third wiring D6. There may be a contact and/or a via (not shown) connecting at least one of the seventh wiring D7 to at least one of the third wiring D6; however, example embodiments are not limited thereto. In some embodiments, although the width of the seventh wiring D7 may be wider than the widths of the fourth wiring M1, the fifth wiring M3, and the sixth wiring M5, the embodiments are not limited thereto.

The fourth wiring M1, the fifth wiring M3, the sixth wiring M5, and the seventh wiring D7 may be insulated from each other by the interlayer insulating film 10. Further, the fourth wiring M1, the fifth wiring M3, the sixth wiring M5, and the seventh wiring D7 may be insulated from the gate wiring PC, the first wiring M2, the second wiring M4, and the third wiring D6 by the interlayer insulating film 10. In some example embodiments, there may be vias/contacts (not shown) connecting each wiring PC, M1, M2, M3, M4, M5, D6, and D7 to each other.

Referring to FIG. 10, the fourth wirings M1 may be spaced apart from each other by a fourth pitch P1 and may extend in the second direction X. The fourth wirings M1 may be spaced apart from each other by the fourth pitch P1 in the first direction and may extend in the second direction X side by side. For example, a center of each of the fourth wirings M1 may be spaced apart from each other in the first direction Y by the fourth pitch P1. Alternatively or additionally, a top edge (resp. a bottom edge) of each of the fourth wirings M1 may be spaced apart from a top edge (resp. bottom edge) of a neighboring fourth wiring M1 by the fourth pitch P1.

Referring to FIG. 11, the fifth wirings M3 may be spaced apart from each other by a fifth pitch P3 and may extend in the second direction X. The fifth wiring M3 may be spaced apart from each other by the fifth pitch P3 in the first direction Y and may extend in the second direction X side by side. For example, a center of each of the fifth wirings M3 may be spaced apart from each other in the first direction Y by the fifth pitch P3. Alternatively or additionally, a top edge (resp. a bottom edge) of each of the fifth wirings M3 may be spaced apart from a top edge (resp. bottom edge) of a neighboring fifth wiring M3 by the fifth pitch P3.

Referring to FIG. 12, the sixth wirings M5 may be spaced apart from each other by a sixth pitch P5 and may extend in the second direction X. The sixth wiring M5 may be spaced apart from each other by the sixth pitch P5 in the first direction Y and may extend in the second direction X side by side. For example, a center of each of the sixth wirings M5 may be spaced apart from each other in the first direction Y by the sixth pitch P5. Alternatively or additionally, a top edge (resp. a bottom edge) of each of the sixth wirings M5 may be spaced apart from a top edge (resp. bottom edge) of a neighboring sixth wiring M5 by the sixth pitch P5.

Referring to FIG. 13, the seventh wirings D7 may be spaced apart from each other by a seventh pitch P7 and may extend in the second direction X. The seventh wiring D7 may be spaced apart from each other by the seventh pitch P7 in the first direction Y and may extend in the second direction X side by side. For example, a center of each of the seventh wirings D7 may be spaced apart from each other in the first direction Y by the seventh pitch P6. Alternatively or additionally, a top edge (resp. a bottom edge) of each of the seventh wirings D7 may be spaced apart from a top edge (resp. bottom edge) of a neighboring seventh wiring D7 by the seventh pitch P7.

In some example embodiments, a ratio between the fourth pitch P1 of the fourth wiring M1 and the fifth pitch P3 of the fifth wiring M3 satisfies 5:4. The fourth pitch P1 may be greater than the fifth pitch P3.

Further, in some example embodiments, a ratio between the fourth pitch P1 of the fourth wiring M1, the fifth pitch P3 of the fifth wiring M3, and the sixth pitch P5 of the sixth wiring M5 is/satisfies 5:4:6. The sixth pitch P5 may be greater than the fourth pitch P1, and the fifth pitch P3.

Further, in some example embodiments, a ratio between the fourth pitch P1 of the fourth wiring M1, the fifth pitch P3 of the fifth wiring M3, the sixth pitch P5 of the sixth wiring M5 and the seventh pitch P7 of the seventh wiring D7 is/satisfies 5:4:6:10.

In some example embodiments, a ratio between the fourth pitch P1 of the fourth wiring M1 and the sixth pitch P5 of the sixth wiring M5 is/satisfies 5:6.

In some example embodiments, a ratio between the fourth pitch P1 of the fourth wiring M1, the sixth pitch P5 of the sixth wiring M5, and the seventh pitch P7 of the seventh wiring D7 is/satisfies 5:6:10.

In some example embodiments, a ratio between the fourth pitch P1 of the fourth wiring M1 and the seventh pitch P7 of the seventh wiring D7 is/satisfies 5:10.

In some example embodiment, a ratio between the fifth pitch P3 of the fifth wiring M3 and the sixth pitch P5 of the sixth wiring M5 is/satisfies 4:6.

Further, in some example embodiment, a ratio between the fifth pitch P3 of the fifth wiring M3, the sixth pitch P5 of the sixth wiring M5, and the seventh pitch P7 of the seventh wiring D7 is/satisfies 4:6:10.

In some example embodiments, a ratio between the sixth pitch P5 of the sixth wiring M5 and the seventh pitch P7 of the seventh wiring D7 is/satisfies 6:10.

On the other hand, the ratios of any combination not described above in which the ratio between the fourth pitch P1 of the fourth wiring M1, the fifth pitch P3 of the fifth wiring M3, the sixth pitch P5 of the sixth wiring M5, and the seventh pitch P7 of the seventh wiring D7 satisfies 5:4:6:10 can also be implemented under example embodiments.

FIGS. 14 and 15 are diagrams showing a process of determining a wiring pitch of the semiconductor device according to some example embodiments.

Referring to FIG. 14, in order to determine a good, e.g. an optimal, ratio between the gate pitch GP of the gate wiring PC, the first pitch P2 of the first wiring M2, the second pitch P4 of the second wiring M4, and the third pitch P6 of the third wiring D6 extending in the first direction Y, a simulation may be performed n times (n is a very large natural number), while changing first to third pitches P2, P4, and P6.

Specifically, least common multiples (LCM) M1 to Mn may be obtained for each case, while changing the first pitch P2 of the first wiring M2 from a1 to an, changing the second pitch P4 of the second wiring M4 from b1 to bn, and changing the third pitch P6 of the third wiring D6 from c1 to cn.

A case having the smallest least common multiple among the least common multiples (LCM) M1 to Mn calculated for each case corresponds to a case in which a large number, e.g. the most, wirings may be placed within a predetermined (or, alternatively, variably determined) limited area. At this time, a ratio between the gate pitch GP of the gate wiring PC, the first pitch P2 of the first wiring M2, the second pitch P4 of the second wiring M4, and the third pitch P6 of the third wiring D6 satisfies 6:4:5:9.

Similarly, referring to FIG. 15, in order to obtain an improved, e.g. the optimal, ratio between the fourth pitch P1 of the fourth wiring M1, the fifth pitch P3 of the fifth wiring M3, the sixth pitch P5 of the sixth wiring M5 and the seventh pitch P7 of the seventh wiring D7 extending in the second direction X, simulation may be performed n times, while changing the fifth to seventh pitches P3, P5 and P7.

Specifically, the least common multiples (LCM) L1 to Ln were obtained for each case, while changing the fifth pitch P3 of the fifth wiring M3 from d1 to dn, changing the sixth pitch P5 of the sixth wiring M5 from e1 to en, and changing the seventh pitch P7 of the seventh wiring D7 from f1 to fn.

A case having the smallest least common multiple among the least common multiples (LCM) L1 to Ln calculated for each case is a case in which the most wirings may be placed within a limited area. At this time, the ratio between the fourth pitch P1 of the fourth wiring M1, the fifth pitch P3 of the fifth wiring M3, the sixth pitch P5 of the sixth wiring M5, and the seventh pitch P7 of the seventh wiring D7 satisfies 5:4:6:10.

For example, when the wirings PC, M2, M4 and D6 extending in the first direction Y are placed in the semiconductor device such that the ratio between the gate pitch GP of the gate wiring PC, the first pitch P2 of the first wiring M2, the second pitch P4 of the second wiring M4, and the third pitch P6 of the third wiring D6 satisfies 6:4:5:9, since as many wirings as possible may be provided within a limited area, the wiring density of the semiconductor device may be improved. The wiring density of the semiconductor device may be improved even in a case wherein a ratio between pitches of lower wiring such as gate pitch GP to pitches of wirings above such as first pitch P2 does not monotonically vary.

Further, when the wirings M1, M3, M5 and D7 extending in the second direction X are placed in the semiconductor device such that the ratio between the fourth pitch P1 of the fourth wiring M1, the fifth pitch P3 of the fifth wiring M3, the sixth pitch P5 of the sixth wiring M5, and the seventh pitch P7 of the seventh wiring D7 satisfies 5:4:6:10, since as many wirings as possible may be placed within a limited area, the wiring density of the semiconductor device can be improved.

Although other components placed in the semiconductor device are not shown and explained to intensively explain only the relationship between the wirings above, a practical implementation example of the gate wiring PC and the fourth wiring M1 described above will be described below. However, example embodiments are not limited thereto.

On the other hand, in the following drawings, although a fin-type transistor FinFET including a fin-type pattern-shaped channel region is shown as an example of a semiconductor device, example embodiments are not limited thereto. The semiconductor device according to some embodiments may include a tunneling transistor (FET), a transistor including a nanowire, a transistor including a nanosheet or a three-dimensional (3D) transistor. In addition, the semiconductor device according to some embodiments may include a bipolar junction transistor, a lateral double diffusion transistor (LDMOS), and/or the like.

Figure 16:
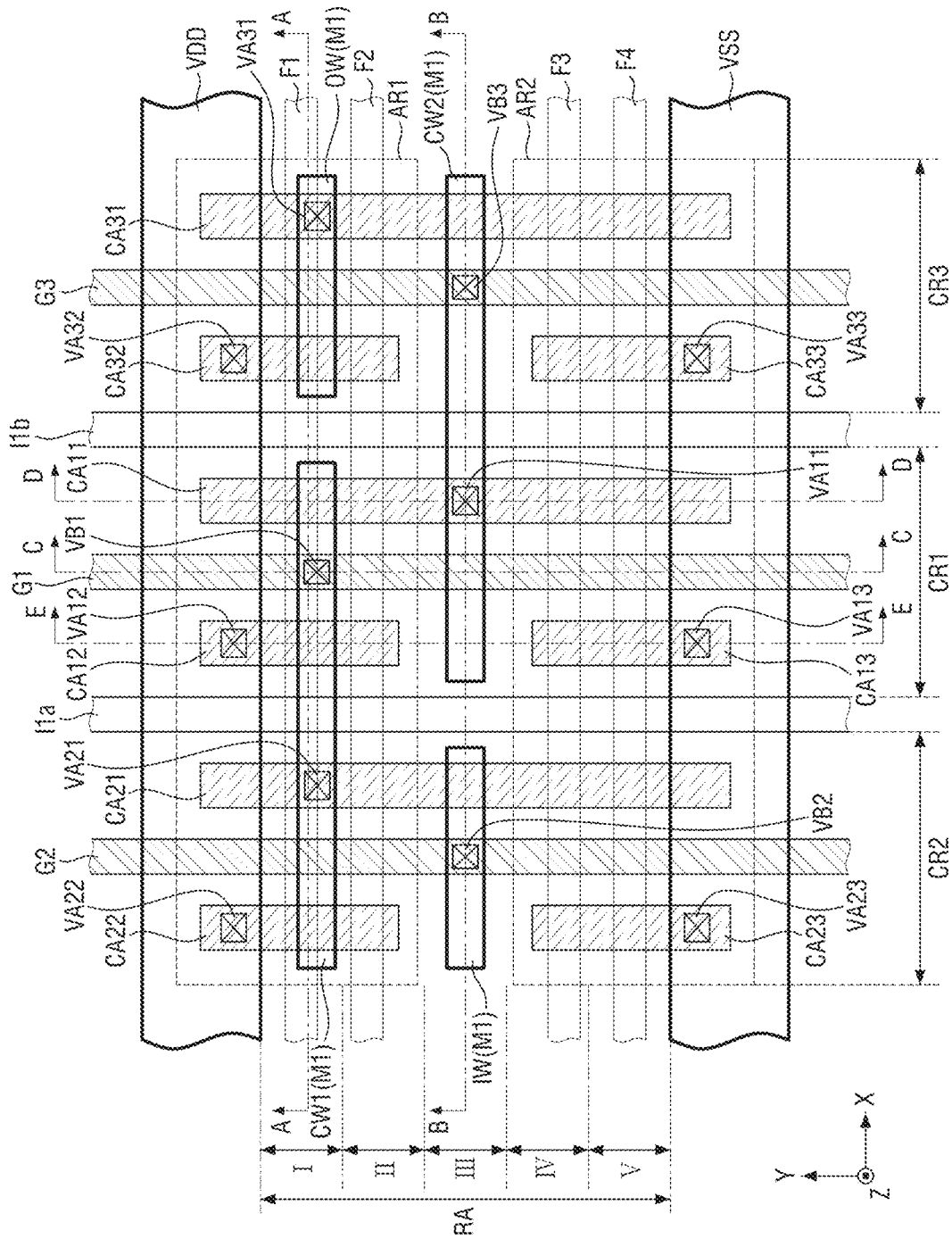
FIG. 16 is a layout for explaining a semiconductor device according to some example embodiments.
Figure 17:
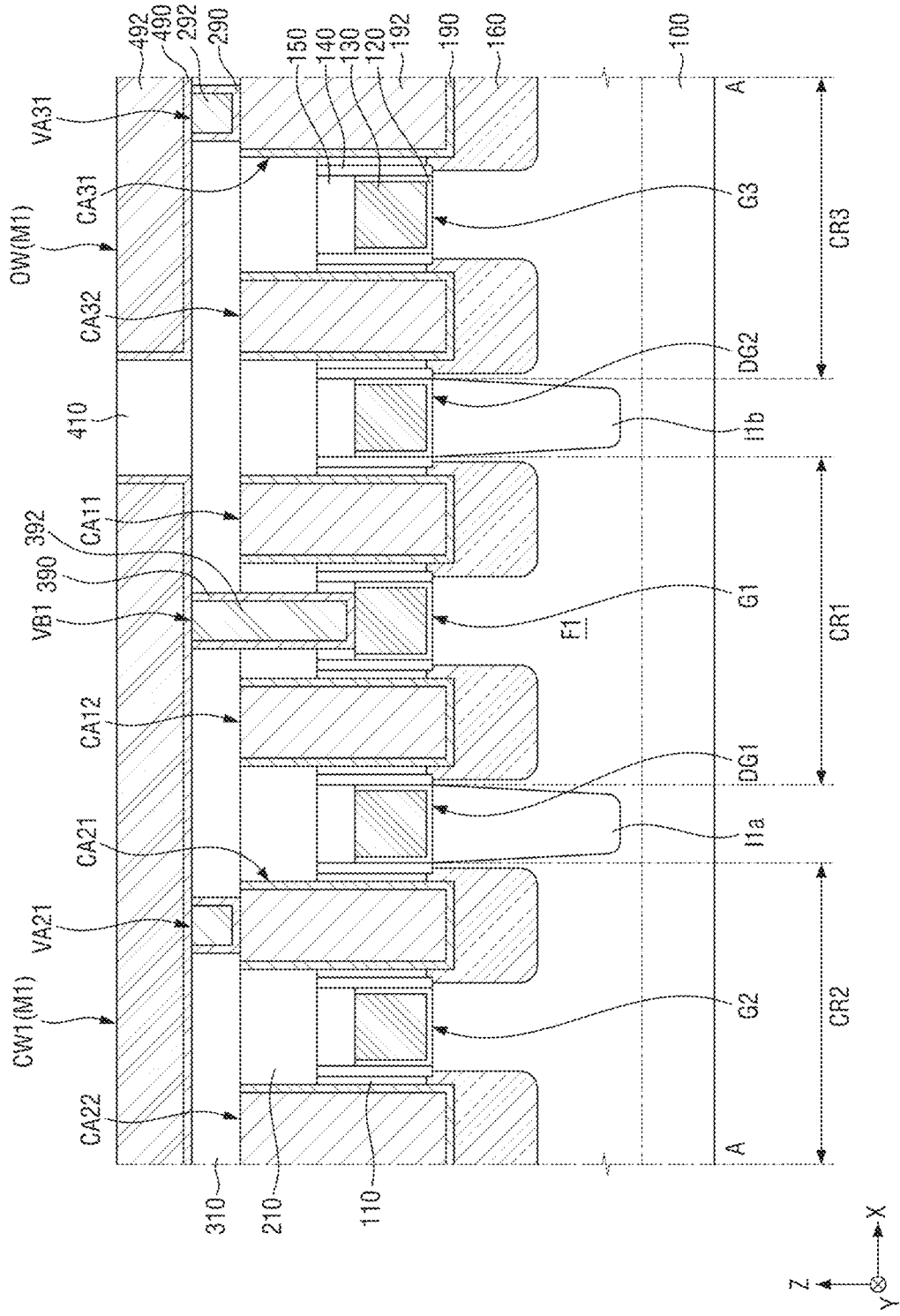
FIG. 17 is a cross-sectional view taken along a line A-A of FIG. 16.
Figure 18:
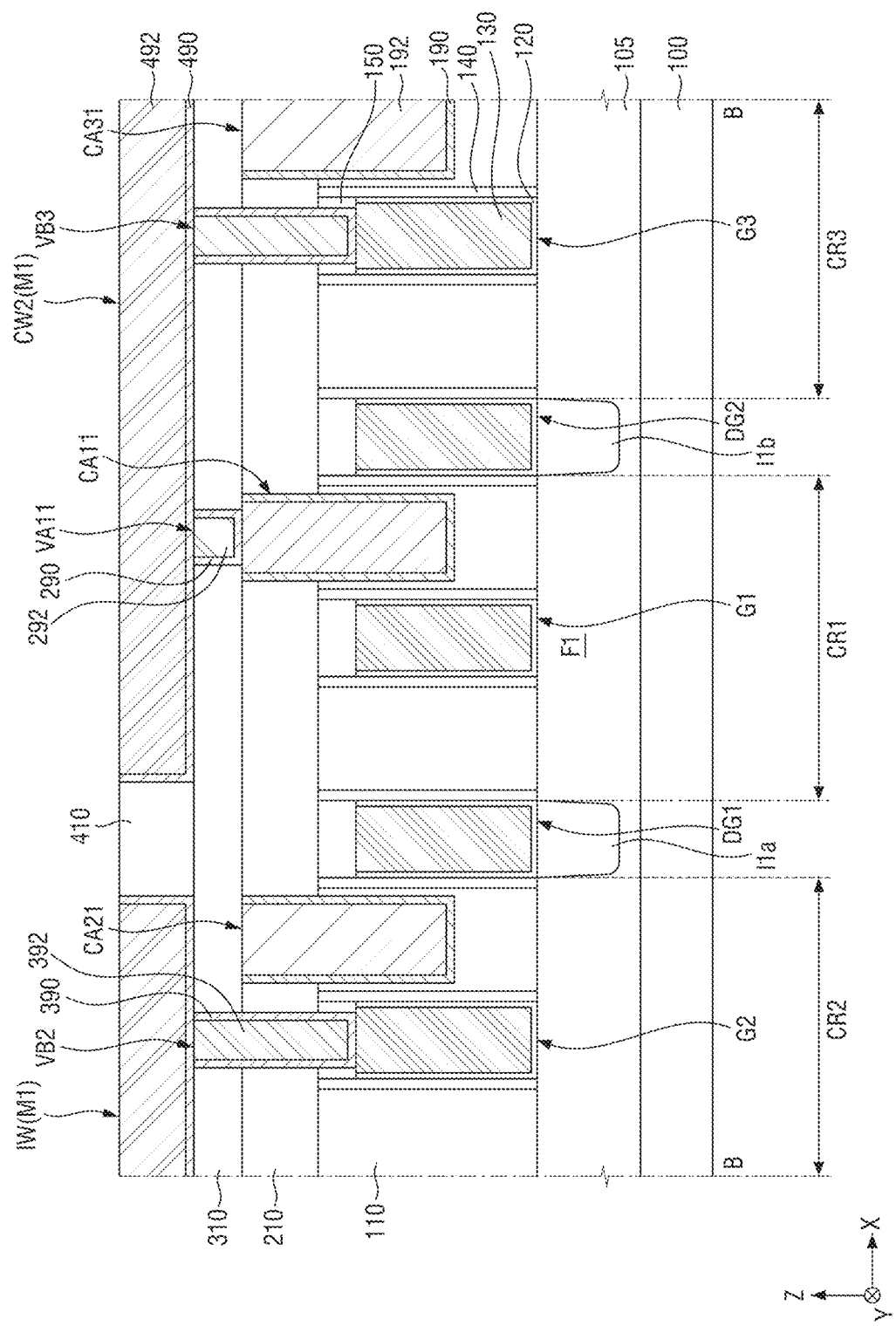
FIG. 18 is a cross-sectional view taken along a line B-B of FIG. 16.
Figure 19:
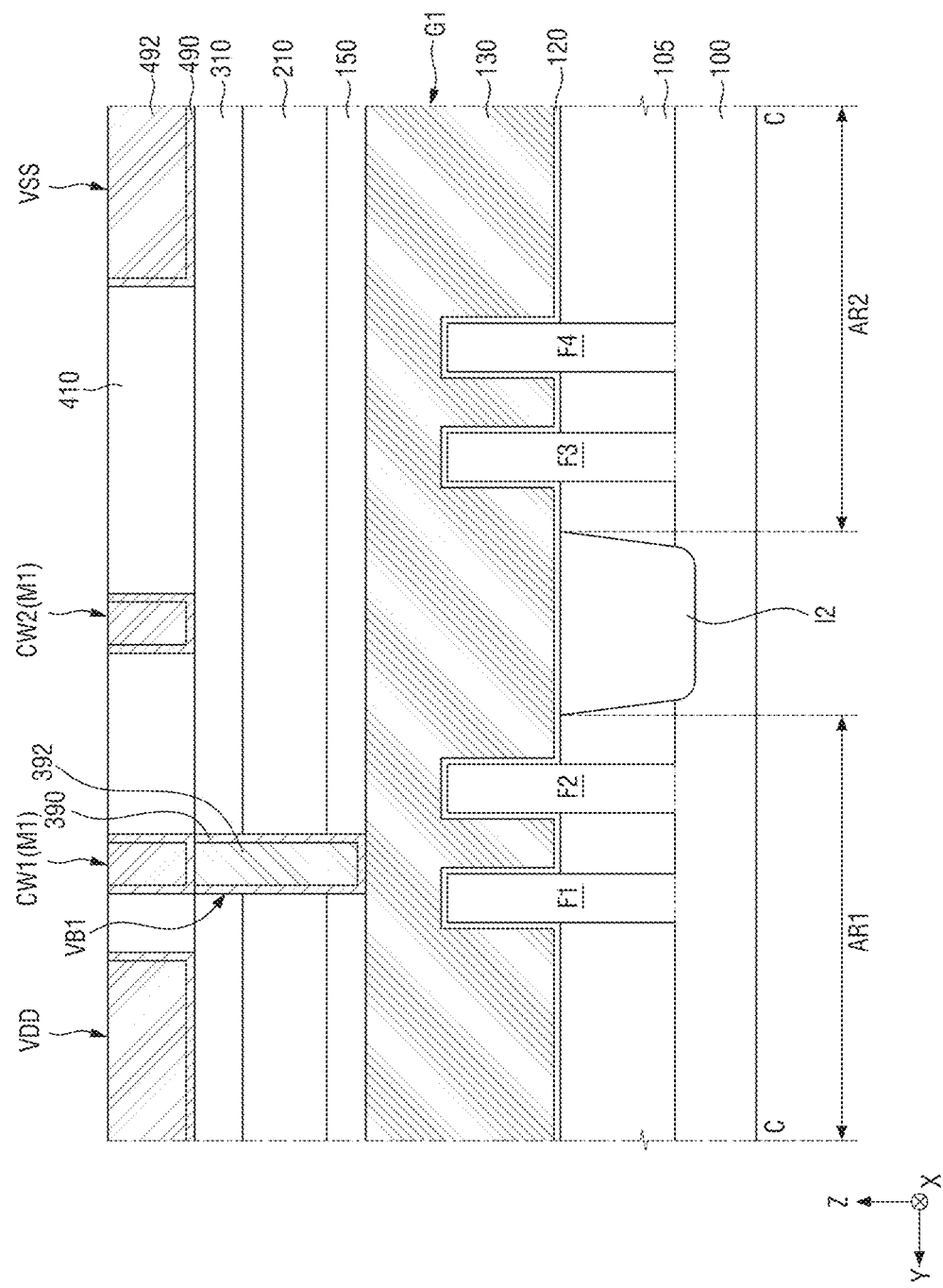
FIG. 19 is a cross-sectional view taken along a line C-C of FIG. 16.
Figure 20:
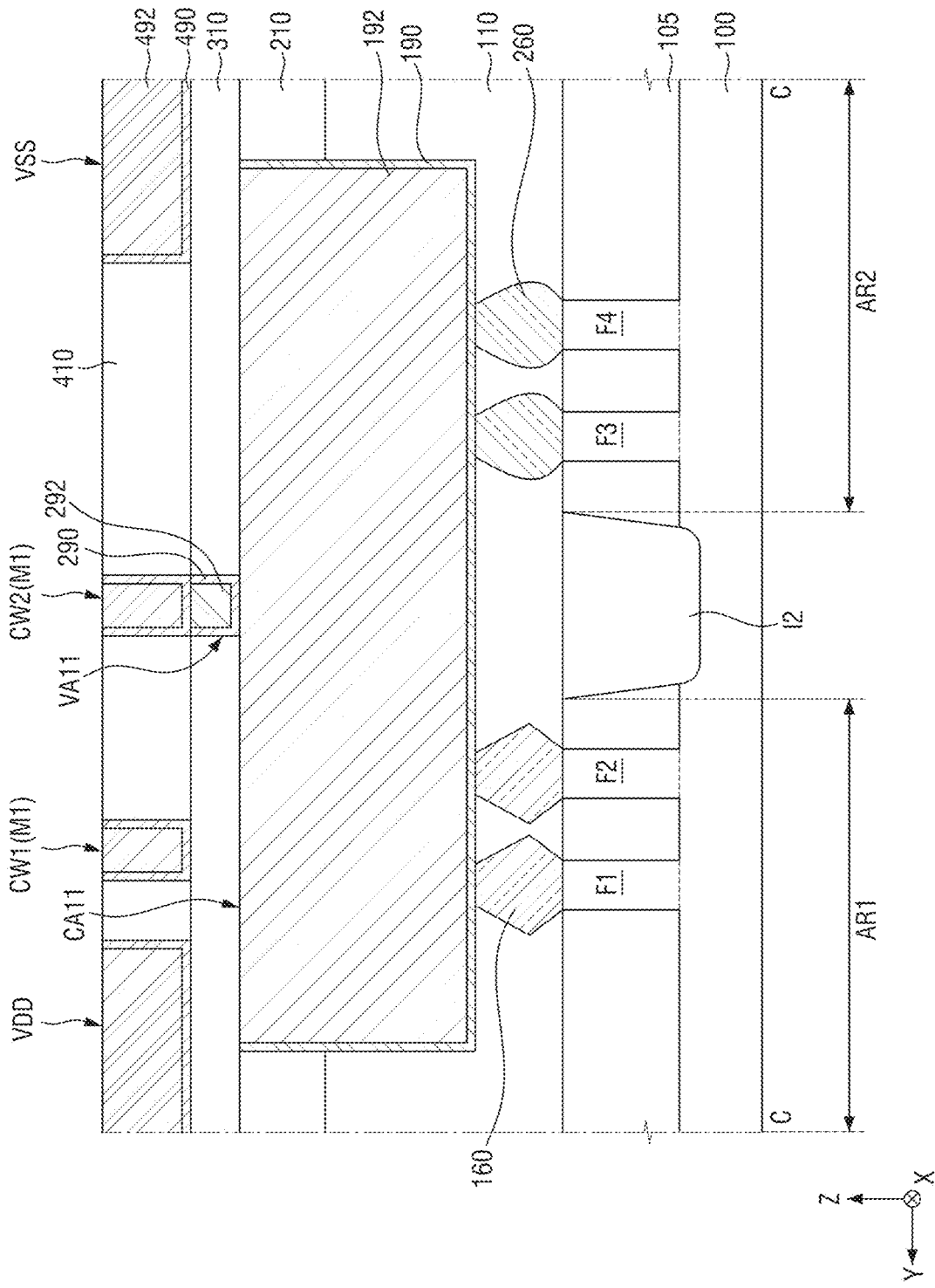
FIG. 20 is a cross-sectional view taken along a line D-D of FIG. 16.
Figure 21:
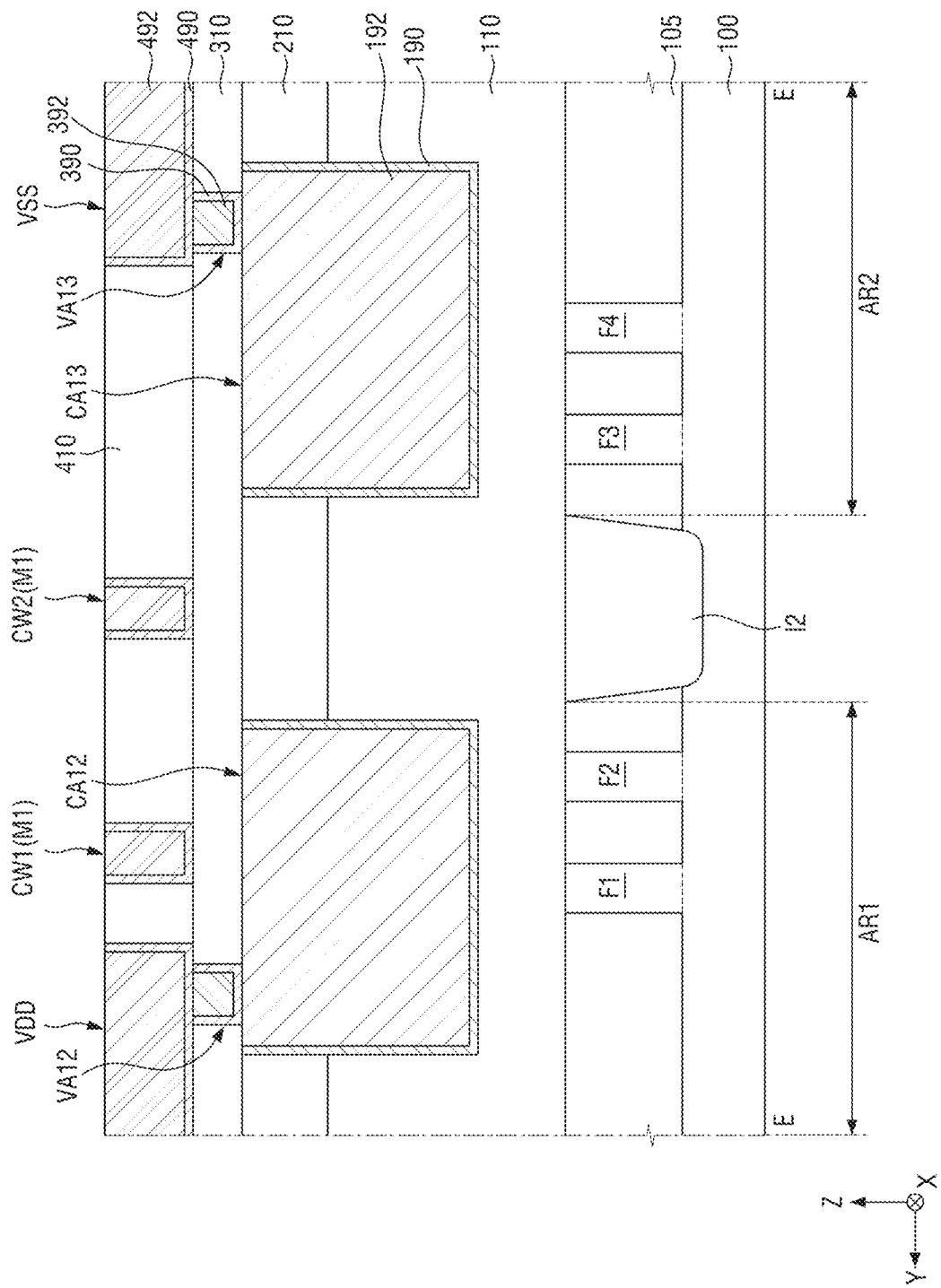
FIG. 21 is a cross-sectional view taken along a line E-E of FIG. 16.

FIG. 16 is a layout for explaining the semiconductor device according to some embodiments. FIG. 17 is a cross-sectional view taken along a line A-A of FIG. 16. FIG. 18 is a cross-sectional view taken along a line B-B of FIG. 16. FIG. 19 is a cross-sectional view taken along a line C-C of FIG. 16. FIG. 20 is a cross-sectional view taken along a line D-D of FIG. 16. FIG. 21 is a cross-sectional view taken along a line E-E of FIG. 16.

Referring to FIGS. 16 to 21, the semiconductor device according to some example embodiments may be formed on a substrate 100.

The substrate 100 may be or include bulk silicon or silicon-on-insulator (SOI). Alternatively or additionally, the substrate 100 may be or include a silicon substrate or may include, but is not limited to, other materials, for example, silicon germanium, silicon germanium on insulator (SGOI), indium antimonide, lead telluride, indium arsenide, phosphide, indium, gallium arsenide and/or gallium antimonide.

The substrate 100 may include a first active region AR1 and a second active region AR2. For convenience of description, hereinafter the first active region AR1 will be described as a PFET region and the second active region AR2 will be described as an NFET region; however, example embodiments are not limited thereto.

In some example embodiments, the first active region AR1 and the second active region AR2 may be separated by an element separation film I2. For example, as shown in FIGS. 19 to 21, the element separation film I2 extends in the second direction X and may separate the first active region AR1 and the second active region AR2.

A plurality of active patterns F1 to F4 may be formed on the substrate 100. For example, first and second active patterns F1 and F2 may be formed on the first active region AR1, and third and fourth active patterns F3 and F4 may be formed on the second active region AR2. In some example embodiments, each of the active patterns F1 to F4 may include a fin-type pattern protruding from an upper surface of the substrate 100.

The first to fourth active patterns F1 to F4 may be spaced apart from each other and may extend side by side. For example, each of the first to fourth active patterns F1 to F4 may extend in the second direction X. Further, the first to fourth active patterns F1 to F4 may be sequentially arranged along the first direction Y. In some example embodiments, the first to fourth active patterns F1 to F4 may be formed over the first to third cell regions CR1 to CR3, respectively.

In some example embodiments, the first cell separation film I1a and the second cell separation film I1b may intersect the first to fourth active patterns F1 to F4. The first cell separation film I1a and the second cell separation film I1b may define first to third cell regions CR3 across the first to fourth active patterns F1 to F4. For example, as shown in FIGS. 17 and 18, the first cell separation film I1a may define the first cell region CR1 and the second cell region CR2 across the first active pattern F1. Further, the second cell separation film I1b may define a first cell region CR1 and a third cell region CR3 across the first active pattern F1.

The field insulating film 105 may be formed on the substrate 100. In some example embodiments, the field insulating film 105 may surround some of the side surfaces of the first to fourth active patterns F1 to F4. For example, as shown in FIG. 19, some of the first to fourth active patterns F1 to F4 may protrude upward from the field insulating film 105.

The field insulating film 105 may include, for example, but not limited to, at least one of silicon oxide ($SiO_2$), silicon nitride (SiN), silicon oxynitride (SiON), silicon oxycarbonitride (SiOCN) or a combination thereof.

The gate electrodes G1 to G3 may intersect the first to fourth active patterns F1 to F4, respectively. In some example embodiments, the gate electrodes G1 to G3 may correspond to the gate wirings (PC of FIG. 4) described above. Also, in some example embodiments, although it is not shown in detail, the gate wiring (PC of FIG. 4) described above may correspond to wirings electrically connected to the gate electrodes G1 to G3.

The gate electrodes G1 to G3 may each include a gate conductive film 130. The gate conductive film 130 may include, for example, but is not limited to, at least one of Ti, Ta, W, Al, Co, or a combination thereof. The gate conductive film 130 may include, for example, doped or undoped single-crystal or polysilicon or doped or undoped single-crystal or polysilicon-germanium other than metal.

Although the gate conductive film 130 is shown as a single film in the drawings, example embodiments not limited thereto. Unlike the shown example, the gate conductive film 130 may be formed by stacking a plurality of conductive materials. For example, the gate conductive film 130 may include a work function adjusting film for adjusting a work function, and/or a filling conductive film which fills a space formed by the work function adjusting film. The work function adjusting film may include, for example, at least one of TiN, TaN, TiC, TaC, TiAlC, or a combination thereof. The filling conductive film may include, for example, W and/or Al.

The gate conductive film 130 may be formed through, for example, but is not limited to, a replacement process.

In some example embodiments, a first dummy gate electrode DG1 and a second dummy gate electrode DG2 each intersecting the first to fourth active patterns F1 to F4 may be formed. The first dummy gate electrode DG1 may extend in the first direction Y between the first cell region CR1 and the second cell region CR2, and the second dummy gate electrode DG2 may extend in the first direction Y between the first cell region CR1 and the third cell region CR3.

In some example embodiments, the first dummy gate electrode DG1 may be formed on the first cell separation film I1a, and the second dummy gate electrode DG2 may be formed on the second separation film I1b. In some example embodiments, the first dummy gate electrode DG1 and the second dummy gate electrode DG2 may be omitted. For example, the first cell separation film I1a and the second cell separation film I1b may be formed to fill a region occupied by the first dummy gate electrode DG1 and the second dummy gate electrode DG2.

A gate dielectric film 120 may be interposed between the first to fourth active patterns F1 to F4 and the gate conductive film 130. For example, the gate dielectric film 120 may extend along the side wall and the bottom surface of the gate conductive film 130. However, example embodiments are not limited thereto, and the gate dielectric film 120 may extend only along the bottom surface of the gate conductive film 130.

In some example embodiments, a part of the gate dielectric film 120 may be interposed between the field dielectric film 105 and the gate conductive film 130. For example, as shown in FIG. 19, the gate dielectric film 120 may extend along the upper surface of the field insulating film 105.

The gate dielectric film 120 may include, for example, at least one of silicon oxide, silicon oxynitride, silicon nitride, or a high-k material having a higher dielectric constant than silicon oxide. The high-k material may include, for example, but is not limited to, hafnium oxide.

The gate spacer 140 may be formed on the substrate 100 and the field insulating film 105. Further, the gate spacer 140 may extend along both sides of the gate conductive film 130. Accordingly, the gate spacer 140 may intersect the first to fourth active patterns F1 to F4. For example, the gate spacer 140 may extend in the first direction Y.

The gate spacer 140 may include, for example, but is not limited to, at least one of silicon oxide, silicon nitride, silicon oxynitride, or combinations thereof.

A gate capping pattern 150 may cover the upper surface of the gate conductive film 130. For example, the gate capping pattern 150 may extend along the upper surface of the gate conductive film 130. In addition, the gate capping pattern 150 may extend in the first direction Y.

A first source/drain region 160 may be formed on the first active region AR1. For example, the first source/drain region 160 may be formed in the first and second active patterns F1 and F2 on both sides of the gate conductive film 130. However, the first source/drain region 160 may be insulated from the gate conductive film 130. For example, the first source/drain region 160 may be spaced apart from the gate conductive film 130 by the gate spacer 140.

A second source/drain region 260 may be formed on the second active region AR2. For example, the second source/drain region 260 may be formed in the third and fourth active patterns F3 and F4 on both sides of the gate conductive film 130. However, the second source/drain region 260 may be insulated from the gate conductive film 130. For example, the second source/drain region 260 may be spaced apart from the gate conductive film 130 by the gate spacer 140.

Each of the first source/drain region 160 and the second source/drain region 260 may include an epitaxial layer, e.g. a doped or undoped heterogeneous or homogenous epitaxial layer, formed in each of the first to fourth active patterns F1 to F4.

When the semiconductor device formed in the first active region AR1 is a PFET, the first source/drain region 160 may include a p-type impurity and/or an impurity for preventing or reducing the amount of diffusion of the p-type impurity. For example, the first source/drain region 160 may include at least one of a group-III element such as B, In, Ga, and Al, or a combination thereof, and may include a group-IV element such as C, Ge, and/or Sn, however, example embodiments are not limited thereto.

When the semiconductor device formed in the second active region AR2 is an NFET, the second source/drain region 260 may include an n-type impurity and/or an impurity for preventing or reducing the amount of diffusion of the n-type impurity. For example, the second source/drain region 260 may include at least one of a group-V element such as P, Sb, zAs or a combination thereof, and may include a group-IV element such as C, Ge, and/or Sn; however, example embodiments are not limited thereto.

Although each of the first source/drain region 160 and the second source/drain region 260 is shown as a single film example embodiments not limited thereto. For example, the first source/drain region 160 and the second source/drain region 260 may be formed of multi-films each containing concentrations of impurities different from each other.

A plurality of interlayer insulating films 110, 210, 310 and 410 may be formed on the substrate 100. For example, first to fourth interlayer insulating films 110, 210, 310 and 410 sequentially stacked may be formed on the substrate 100.

In some example embodiments, the first interlayer insulating film 110 and the second interlayer insulating film 210 may be formed to cover the field insulating film 105, the first source/drain region 160, the second source/drain region 260, the gate spacer 140 and the gate capping pattern 150. For example, the first interlayer insulating film 110 may cover the upper surface of the field insulating film 105, the upper surface of the first source/drain region 160, the upper surface of the second source/drain region 260, and the side surface of the gate spacer 140. Further, for example, the second interlayer insulating film 210 may cover the upper surface of the gate capping pattern 150 and the upper surface of the first interlayer insulating film 110.

The first to fourth interlayer insulating films 110, 210, 310 and 410 may include, for example, at least one of silicon oxide, silicon nitride, silicon oxynitride, and/or a low-k material having a lower dielectric constant than silicon oxide.

Further, in some example embodiments, a plurality of source/drain contacts CA11 to CA33 may penetrate the first interlayer insulating film 110 and the second interlayer insulating film 210 and may be connected to the first source/drain region 160 and/or the second source/drain region 260. For example, the second, fourth and eighth source/drain contacts CA12, CA22 and CA32 may be connected to the first source/drain region 160. Also, for example, the third, sixth, and ninth source/drain contacts CA13, CA23 and CA33 may be connected to the second source/drain region 260. In some example embodiments, the first, fourth, and seventh source/drain contacts CA11, CA21 and CA31 may be connected to both the first source/drain region 160 and the second source/drain region 260. The plurality of contacts CA11 to CA33 may be or include doped polysilicon and/or a metal such as tungsten; however, example embodiments are not limited thereto.

In some example embodiments, a plurality of source/drain vias VA11 to VA33 may penetrate the third interlayer insulating film 310 and may be connected to the source/drain contacts CA11 to CA33. The source/drain vias VA11 to VA33 may include a metal such as tungsten; however, example embodiments are not limited thereto.

In some example embodiments, a plurality of gate vias VB1 to VB3 may penetrate the gate capping pattern 150, the second interlayer insulating film 210, and the third interlayer insulating film 310 and may be connected to the gate electrodes G1 to G3. The gate vias VB1 to VB3 may include doped polysilicon and/or a metal such as tungsten; however, example embodiments are not limited thereto.

In some example embodiments, the plurality of wiring patterns M1 may be placed at the same level as each other. When used herein, the expression "placed at the same level" means formation at the same height on the basis of the upper surface of the substrate 100. Further, when used herein, the term "same" is meant to include not only completely the same thing, but also a slight difference that may occur due to a margin in a process or the like.

In some example embodiments, the plurality of wiring patterns M1 may correspond to the fourth wiring pattern (M1 of FIG. 10) described above.

For example, as shown in FIGS. 16 and 17, a first connection wiring CW1 is formed in the fourth interlayer insulating film 410, and may be connected to the fourth source/drain via VA21 and the first gate via VB1. Further, a second wiring OW is formed in the fourth interlayer insulating film 410 and may be connected to the seventh source/drain via VA31.

For example, as shown in FIGS. 16 and 18, a first wiring IW is formed in the fourth interlayer insulating film 410 and may be connected to the second gate via VB2. Further, a second connection wiring CW2 is formed in the fourth interlayer insulating film 410 and may be connected to the first source/drain via VA11 and the third gate via VB3.

Further, in some example embodiments, the plurality of wiring patterns M1 may be formed by the same fabrication/manufacturing process.

In some example embodiments, the plurality of wiring patterns M1 may be placed at the same level as the first power supply wiring VDD and/or the second power supply wiring VSS.

For example, as shown in FIGS. 16 and 21, the first power supply wiring VDD is formed in the fourth interlayer insulating film 410, and may be connected to the second, fifth, and eighth source/drain vias VA12, VA22 and VA32. Further, the second power supply wiring VSS is formed in the fourth interlayer insulating film 410, and may be connected to the third, sixth, and ninth source/drain vias VA13, VA23 and VA33.

Further, in some example embodiments, the plurality of wiring patterns M1 may be formed at the same level as the first power supply wiring VDD and/or the second power supply wiring VSS.

Thus, it may be possible to provide a semiconductor device in which the power loss and the PnR resource loss are reduced, e.g. by reducing the use of the additional upper wiring.

In some example embodiments, the source/drain contacts CA11 to CA33 may include a first barrier film 190 and a first filling film 192, respectively. The first barrier film 190 may extend along an upper surface of the first source/drain region 160, an upper surface of the second source/drain region 260, a side surface of the first interlayer insulating film 110, and a side surface of the second interlayer insulating film 210. The first filling film 192 may fill a space formed by the first barrier film 190.

In some example embodiments, the source/drain vias VA11 to VA33 may include a second barrier film 290 and a second filling film 292, respectively. The second barrier film 290 may extend along the upper surfaces of the source/drain contact CA11 to CA33 and the side surface of the third interlayer insulating film 310. The second filling film 292 may fill the space formed by the second barrier film 290.

In some example embodiments, the gate vias VB1 to VB3 may include a third barrier film 390 and a third filling film 392, respectively. The third barrier film 390 may extend along on the upper surfaces of the gate electrodes, the side surface of the gate capping pattern 150, the side surface of the second interlayer insulating film 210 and the side surface of the third interlayer insulating film 310. The third filling film 392 may fill the space formed by the third barrier film 390.

In some example embodiments, the first power supply wiring VDD, the second power supply wiring VSS, and the plurality of wiring patterns M1 may include a fourth barrier film 490 and a fourth filling film 492, respectively. The fourth barrier film 490 may extend along the upper surfaces of the source/drain vias VA11 to VA33, the upper surfaces of the gate vias VB1 to VB3, the upper surface of the third interlayer insulating film 310, and the side surface of the fourth interlayer insulating film 410. The fourth filling film 492 may fill the space formed by the fourth barrier film 490.

The first to fourth barrier films 490 may include a metal or a metal nitride for preventing or reducing the amount of diffusion of the first to fourth filling films 492. For example, the first to fourth barrier films 490 may include, but is not limited to, at least one of titanium (Ti), tantalum (Ta), tungsten (W), nickel (Ni), cobalt (Co), platinum (Pt), an alloy thereof, or a nitride thereof.

The first to fourth filling films 492 may include, but is not limited to, at least one of aluminum (Al), copper (Cu), tungsten (W), molybdenum (Mo), cobalt (Co), or an alloy thereof.

The source/drain vias VA11 to VA33, the gate vias VB1 to VB3, the first power supply wiring VDD, the second power supply wiring VSS and the wiring patterns M1 may be formed by, for example, but is not limited to, a single damascene process. For example, the source/drain vias VA11 to VA33, the gate vias VB1 to VB3, the first power supply wiring VDD, the second power supply wiring VSS and the wiring patterns M1 may be formed by, for example, a dual damascene process or another wiring process.

Another example embodiment of the gate wiring PC and the fourth wiring M1 described above will be described below with reference to FIGS. 22 and 23. First, repeated parts of the contents described above with reference to FIGS. 16 to 21 will be briefly described or omitted.

Figure 22:
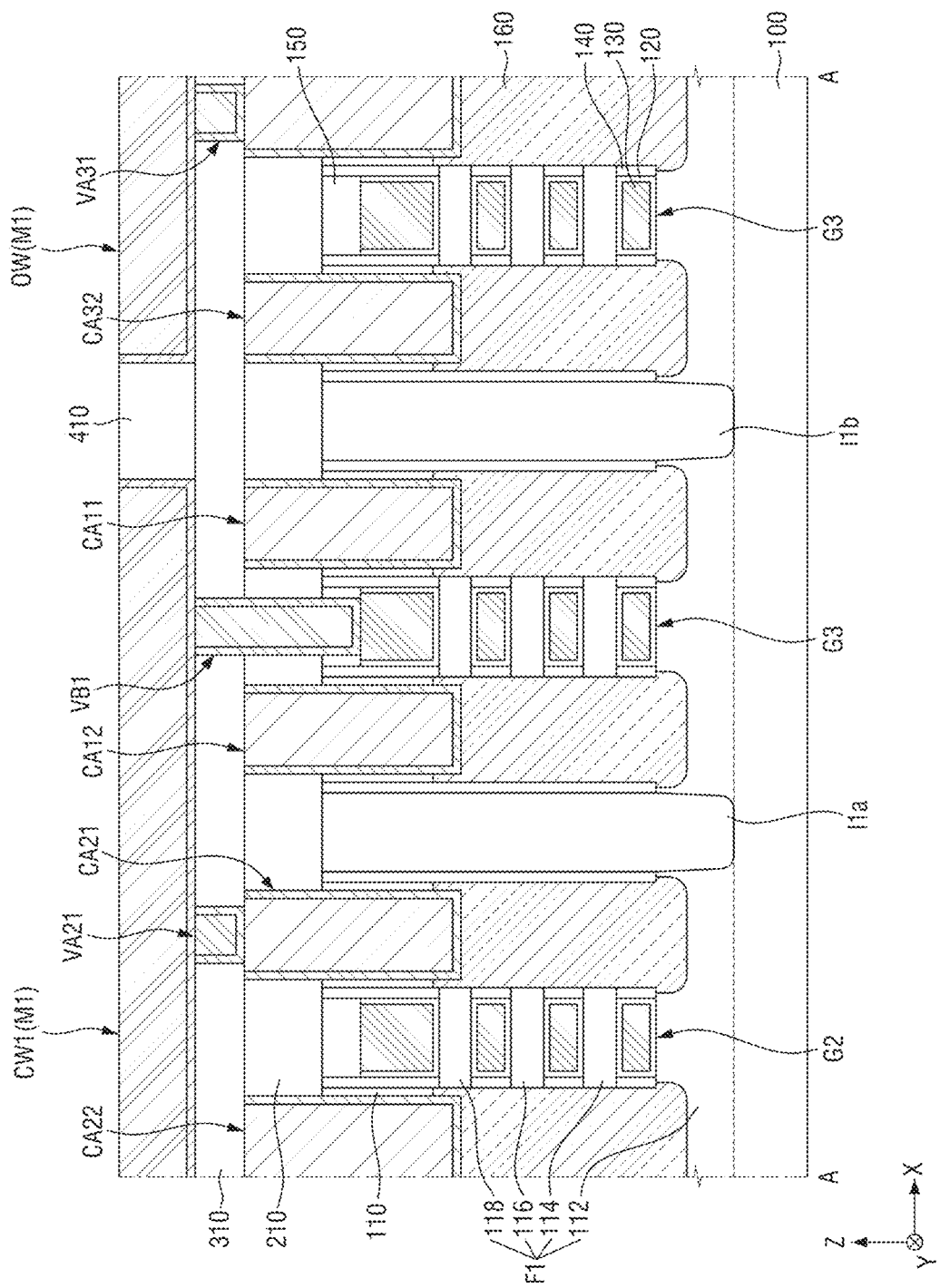
FIGS. 22 and 23 are cross-sectional views showing a semiconductor device according to some example embodiments.
Figure 23:
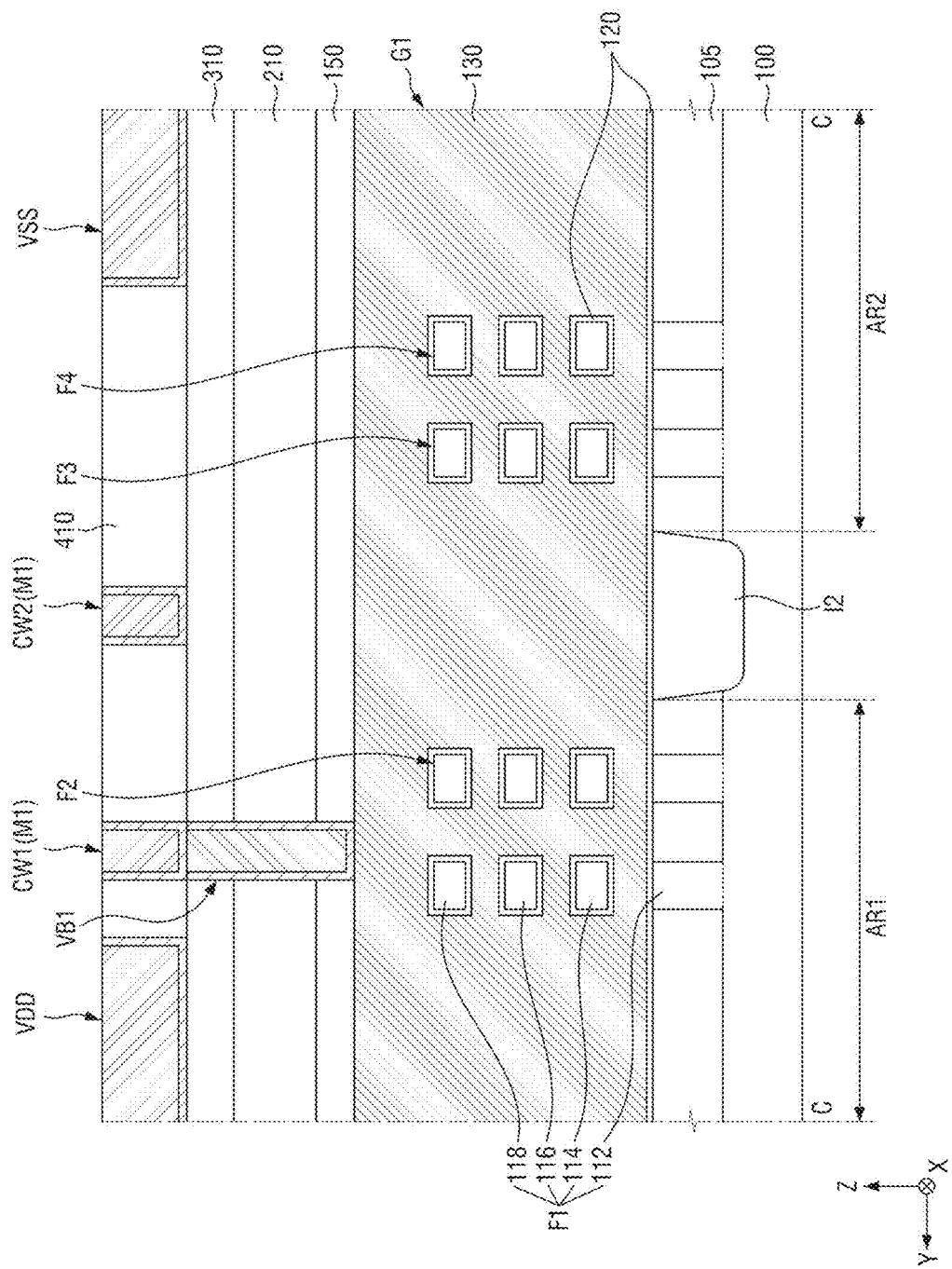

FIGS. 22 and 23 are cross-sectional views for explaining a semiconductor device according to some embodiments.

FIG. 22 is a cross-sectional view taken along a line A-A of FIG. 16, and FIG. 23 is a cross-sectional view taken along a line C-C of FIG. 16.

Referring to FIGS. 22 and 23, in the semiconductor device according to some embodiments, the first to fourth active patterns F1 to F4 each include a plurality of wire patterns 114, 116 and 118.

For example, the first to fourth active patterns F1 to F4 may include first to third wire patterns 114, 116 and 118 which are sequentially stacked on the substrate 100 and are spaced apart from each other. For example, the first wire pattern 114 may be spaced apart from the substrate 100 in a third direction Z, the second wire pattern 116 may be spaced apart from the first wire pattern 114 in the third direction Z, and the third wire pattern 118 may be spaced apart from the second wire pattern 116 in the third direction Z.

Each of the first to third wire patterns 114, 116 and 118 may extend in the second direction X. Further, the first to third wire patterns 114, 116 and 118 may penetrate the first to third gate electrodes G1 to G3, respectively. Therefore, as shown in FIG. 22, the first to third gate electrodes G1 to G3 may surround the outer surfaces of the first to third wire patterns 114, 116 and 118, respectively.

Although the cross sections of the first to third wire patterns 114, 116 and 118 are shown as a rectangular shape in FIG. 23, example embodiments are not limited thereto. For example, the cross sections of the first to third wire patterns 114, 116 and 118 may be other polygonal shape or a circular shape, respectively.

In some example embodiments, the first to fourth active patterns F1 to F4 may each further include a fin type pattern 112 protruding from the upper surface of the substrate 100 and extending in the second direction X. The fin type pattern 112 may be placed, for example, below the first wire pattern 114.

Figure 24:
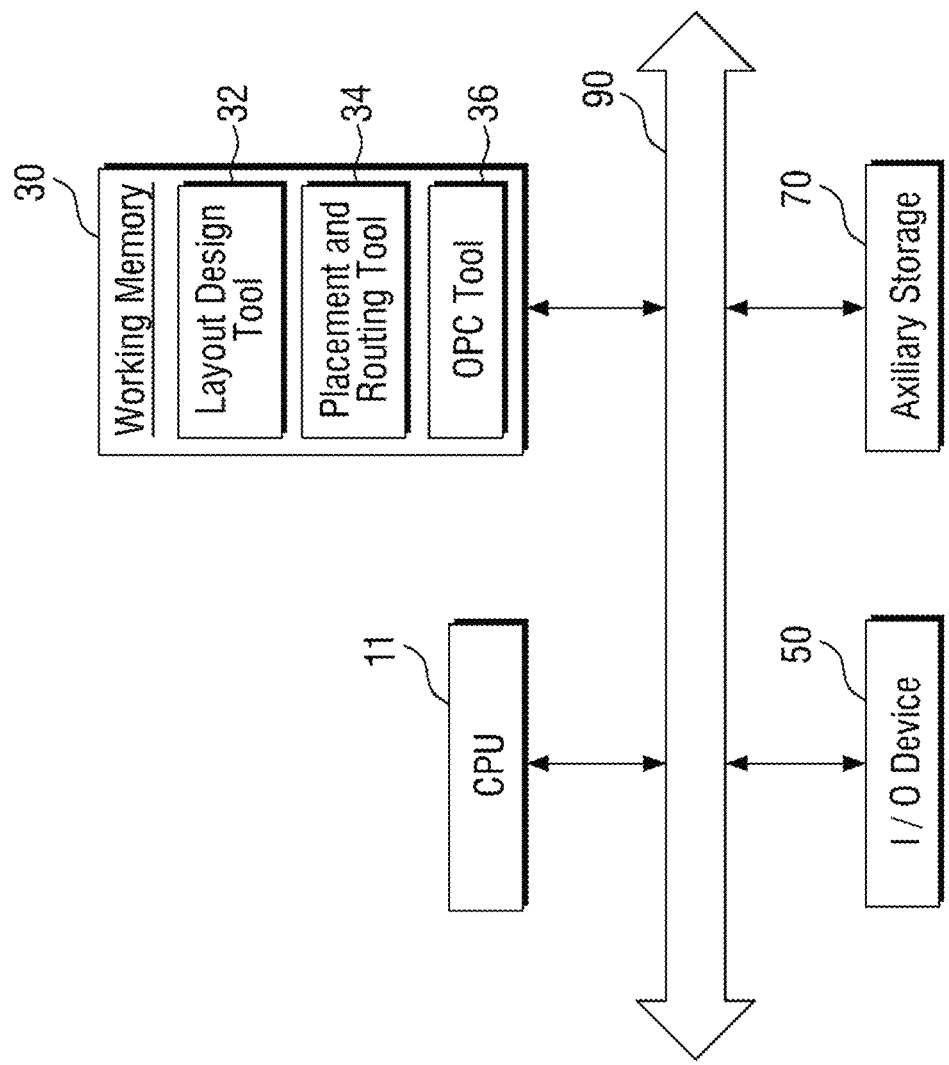
FIG. 24 is a block diagram of a computer system for executing a layout design of the semiconductor device according to some example embodiments.

FIG. 24 is a block diagram of a computer system for executing a layout design of a semiconductor device according to some embodiments.

Referring to FIG. 24, the computer system may include a CPU 11, a working memory 30, an I/O device 50, and an auxiliary storage 70. Here, the shown computer system may be provided as a dedicated device for layout design of the semiconductor device according to some example embodiments. In some example embodiments, the computer system may include various design and verification simulation programs.

The CPU 11 may execute computer-readable instructions such as software (an application program, an operating system, a device driver and/or the like) to be executed on the computer system. When executed by the CPU 11, the computer-readable instructions may cause the CPU to perform various functions. The CPU 11 may execute then operating system loaded into the working memory 30. The CPU 11 may execute various applications (an application program) to be driven on the basis of the operating system. For example, the CPU 11 may execute a layout design tool 32, a placement and routing tool 34 and/or an OPC tool 36 loaded into the working memory 30.

The operating system and/or the application programs may be loaded into the working memory 30. An operating system image (not shown) stored in the auxiliary storage 70 when the computer system starts up may be loaded into the working memory 30 on the basis of a booting sequence. The operating system may support all I/O operations of the computer system.

A layout design tool 32 for layout design of the semiconductor device according to some embodiments may be loaded from the auxiliary storage 70 into the working memory 30. Subsequently, the placement and routing tool 34 for placing the designed standard cells, rearranging the internal wiring patterns in the placed standard cells, and routing the placed standard cells may be loaded into the working memory 30 from the auxiliary storage 70.

When an internal wiring pattern in a standard cell thus placed is placed and/or rearranged, the ratio between the pitches of the wiring patterns described above may be applied.

Specifically, the wiring patterns may be placed or rearranged in the standard cells such that the ratio between the gate pitch GP of the gate wiring PC, the first pitch P2 of the first wiring M2, the second pitch P4 of the second wiring M4 and the third pitch P6 of the third wiring D6 extending in the first direction Y satisfies 6:4:5:9. Further, the wiring patterns may be placed or rearranged in the standard cells such that the ratio between the fourth pitch P4 of the fourth wiring M1, the fifth pitch P3 of the fifth wiring M3, the sixth pitch P5 of the sixth wiring M5 and the seventh pitch P7 of the seventh wiring D7 extending in the second direction X satisfies 5:4:6:10.

Subsequently, an OPC tool 36 for performing optical proximity correction (OPC) on the designed layout data may be loaded from the auxiliary storage 70 to the working memory 30.

The I/O device 50 may control user input and output from user interface devices. For example, the I/O device 50 includes a keyboard and a monitor, and may receive input of information from a user. The user may receive input of information on the semiconductor region or data paths that require adjusted operating characteristics, using the I/O device 50. Also, the processing course or the processing result of the OPC tool 36 may be displayed through the I/O device 50.

The auxiliary storage 70 may be provided as a storage medium of a computer system. The auxiliary storage 70 may store application programs, an operating system image, and various data.

A system interconnector 90 may be or include a system bus for providing a network inside the computer system. The CPU 11, the working memory 30, the I/O device 50, and the auxiliary storage 70 are electrically connected through the system interconnector 90, and data may be exchanged each other.

Figure 25:
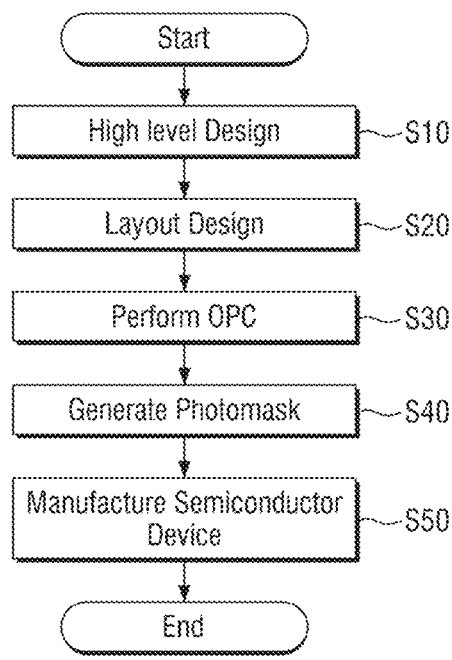
FIG. 25 is a flowchart for explaining a layout design method and a manufacturing method of the semiconductor device according to some example embodiments.

FIG. 25 is a flowchart for explaining a layout design method and a manufacturing method of the semiconductor device according to some embodiments.

Referring to FIG. 25, a high level design of a semiconductor integrated circuit may be executed using the computer system described with reference to FIG. 24 (S10). The high level design may mean description of the integrated circuit to be designed in a parent language of a computer language. For example, a parent language such as a C language may be used for the high level design. Circuits designed by the high level design may be more specifically expressed by register transfer level (RTL) coding or simulation. Subsequently, code generated by the register transfer level coding is converted into a Netlist, and may be synthesized by the entire semiconductor element. A synthesized schematic circuit is verified by a simulation tool, and an adjustment course may be accompanied depending on the verification result.

Subsequently, a layout design for implementing a logically completed semiconductor integrated circuit on a silicon substrate may be performed (S20). For example, the layout design may be performed with reference to the schematic circuit synthesized by the high level design or the Netlist corresponding thereto. The layout design may include a routing procedure for placing and connecting various standard cells provided from a cell library in accordance with a specified design rule.

The layout may be or include a procedure for actually defining the form or size of a pattern for forming a transistor and metal wirings to be formed on the silicon substrate. For example, in order to actually form an inverter circuit on the silicon substrate, layout patterns as a PFET, an NFET, a P-WELL, an N-WELL, a gate electrode, and wiring patterns to be placed thereon may be appropriately placed, e.g. designed for placement on reticles used in fabrication of he semiconductor device.

When the layout patterns are placed in this way, the ratio between the pitches of the wiring patterns described above may be applied.

Specifically, the layout patterns may be placed so that the ratio between the gate pitch GP of the gate wiring PC, the first pitch P2 of the first wiring M2, the second pitch P4 of the second wiring M4, and the third pitch P6 of the third wiring D6 extending in the first direction Y satisfies 6:4:5:9. Further, the layout patterns may be placed so that the ratio between the fourth pitch P4 of the fourth wiring M1, the fifth pitch P3 of the fifth wiring M3, the sixth pitch P5 of the sixth wiring M5 and the seventh pitch P7 of the seventh wiring D7 extending in the second direction X satisfies 5:4:6:10.

Subsequently, routing on the selected and placed standard cells may be performed. Specifically, upper wirings (routing patterns) may be placed on the placed standard cells. By executing the routing, the placed standard cells may be interconnected according to the design.

After routing, the layout may be verified whether there is a portion which violates the design rules. Items to be verified may include a DRC (Design Rule Check), an ERC (Electrical Rule Check), a LVS (Layout vs Schematic), and/or the like.

Subsequently, an optical proximity correction (OPC) procedure may be performed (S30). The layout patterns provided through a layout design may be implemented on a silicon substrate, using a photolithography process. At this time, the optical proximity correction may be a technique for correcting a distortion phenomenon that may occur in a photolithography process.

Subsequently, a photomask may be manufactured on the basis of the layout changed by the optical proximity correction (S40). The photomask may be manufactured, for example, in a manner of drawing the layout patterns, using a chromium film applied on a glass substrate.

Subsequently, a semiconductor element may be manufactured using the generated photomask (S50). In the fabrication/manufacturing process of the semiconductor element using a photomask, various types of exposure and etching processes may be repeated. The form of the patterns formed at the time of layout design may be continuously formed on the silicon substrate through such processes.

In concluding the detailed description, those skilled in the art will appreciate that many variations and modifications may be made to the preferred embodiments without substantially departing from the principles of example embodiments. Therefore, the disclosed example embodiments are used in a generic and descriptive sense only and not for purposes of limitation.

What is claimed is:

1. A semiconductor device comprising:
    a first-direction plurality of wirings extending in a first direction; and
    a second-direction plurality of wirings extending in a second direction intersecting the first direction,
    the first-direction plurality of wirings that extend in the first direction including,
        gate wirings spaced apart from each other in the second direction by a gate pitch,
        first wirings above the gate wirings and above a VDD power supply wiring, the first wirings spaced apart from each other in the second direction by a first pitch,
        second wirings above the first wirings spaced apart from each other in the second direction by a second pitch, and
        third wirings above the second wirings spaced apart from each other in the second direction by a third pitch,
    a ratio between the gate pitch, the first pitch, the second pitch, and the third pitch is 6:4:5:9, the ratio based on a least common multiple of the gate pitch, the first pitch, the second pitch, and the third pitch,
    the second-direction plurality of wirings including,
        the VDD power supply wiring in an interlayer insulating layer,
        a connection wiring in the interlayer insulating layer and directly connected to a gate via that is directly connected to one of the gate wirings, and
        a VSS power supply wiring in the interlayer insulating layer,
    the VDD power supply wiring, the VSS power supply wiring, and the connection wiring placed at a same level in the semiconductor device.

2. The semiconductor device of claim 1, wherein the second-direction plurality of wirings includes,
    fourth wirings spaced apart from each other in the first direction by a fourth pitch, and
    fifth wirings above the fourth wirings spaced apart from each other in the first direction by a fifth pitch,
    the fourth wirings are above the gate wiring and below the first wiring,
    the fifth wirings are above the first wirings and below the second wirings, and
    a ratio between the fourth pitch and the fifth pitch is 5:4.

3. The semiconductor device of claim 2, wherein the second-direction plurality of wirings further includes
    sixth wirings above the fifth wirings spaced apart from each other in the first direction by a sixth pitch,
    the sixth wirings are above the second wirings and below the third wirings, and
    a ratio between the fourth pitch, the fifth pitch, and the sixth pitch is 5:4:6.

4. The semiconductor device of claim 3, wherein the second-direction plurality of wirings further includes
    seventh wires above the sixth wirings spaced apart from each other in the first direction by a seventh pitch,
    the seventh wirings are above the third wirings, and
    a ratio between the fourth pitch, the fifth pitch, the sixth pitch, and the seventh pitch is 5:4:6:10.

5. The semiconductor device of claim 1, wherein the second-direction plurality of wirings includes fourth wirings spaced apart from each other in the first direction by a fourth pitch, fifth wirings on the fourth wirings spaced apart from each other in the first direction by a fifth pitch, and sixth wirings above the fifth wirings spaced apart from each other in the first direction by a sixth pitch, the fourth wirings are above the gate wirings and below the first wirings, the fifth wirings are above the first wirings and below the second wirings, the sixth wirings are above the second wirings and below the third wirings, and a ratio between the fifth pitch and the sixth pitch is 4:6.

6. The semiconductor device of claim 5, wherein the second-direction plurality of wirings includes seventh wirings above the sixth wirings spaced apart from each other in the first direction by a seventh pitch, the seventh wirings are above the third wirings, and a ratio between the fifth pitch, the sixth pitch, and the seventh pitch is 4:6:10.

7. The semiconductor device of claim 1, wherein the second-direction plurality of wirings includes, fourth wirings placed spaced apart from each other in the first direction by a fourth pitch fifth wirings above the fourth wirings spaced apart from each other in the first direction by a fifth pitch, sixth wirings above the fifth wirings spaced apart from each other in the first direction by a sixth pitch in the first direction, seventh wirings above the sixth wirings spaced apart from each other in the first direction by a seventh pitch, the fourth wirings are above the gate wirings and below the first wirings, the fifth wirings are above the first wirings and below the second wirings, the sixth wirings are above the second wirings and below the third wirings, the seventh wirings are above the third wirings, and a ratio between the sixth pitch and the seventh pitch is 6:10.

8. The semiconductor device of claim 1, wherein the VDD power supply wiring, the VSS power supply wiring, and the connection wiring each include a barrier film on bottom surfaces and sidewall surfaces thereof.

9. The semiconductor device of claim 1, wherein a width in the first direction of the VDD power supply is greater than a width in the first direction of the connection wiring.

10. The semiconductor device of claim 1, further comprising:

a plurality of active patterns extending in the second direction;

a plurality of source/drain contacts extending in the first direction, at least one of the plurality of source/drain contacts directly contacting at least one of the plurality of active patterns; and a plurality of source/drain vias, at least one of the plurality of source/drain vias directly contacting the at least one of the plurality of source/drain contacts, wherein the VDD power supply wiring directly contacts the at least one of the plurality of source/drain vias.

11. The semiconductor device of claim 10, wherein at least another one of the plurality of source/drain contacts directly contacts at least another one of the plurality of active patterns, at least another one of the plurality of source/drain vias directly contacts at least another one of the plurality of source/drain contacts, and the VSS power supply wiring directly contacts the at least another one of the plurality of source/drain vias.

12. A semiconductor device comprising:

a first-direction plurality of wirings extending in a first direction and including gate wirings; and a second-direction plurality of wirings extending in a second direction intersecting the first direction, wherein the second-direction plurality of wirings that extend in the second direction includes, fourth wirings spaced apart from each other in the first direction by a fourth pitch and in an interlayer insulating layer, at least one of the fourth wirings directly connected to a gate via that is directly connected to one of the gate wirings, a VDD power supply wiring in the interlayer insulating layer, a VSS power supply wiring in the interlayer insulating layer, fifth wirings above the fourth wirings spaced apart from each other in the first direction by a fifth pitch, sixth wirings above the fifth wirings spaced apart from each other in the first direction by a sixth pitch, and seventh wirings above the sixth wirings spaced apart from each other in the first direction by a seventh pitch, wherein a ratio between the fourth pitch, the fifth pitch, the sixth pitch, and the seventh pitch is 5:4:6:10, the ratio based on a least common multiple of the fourth pitch, the fifth pitch, the sixth pitch, and the seventh pitch, and the VDD power supply wiring, the VSS power supply wiring, and the at least one of the fourth wirings are placed at a same level in the semiconductor device, the same level between the gate wirings and a next-lowest level among levels of the first-direction plurality of wirings.

13. The semiconductor device of claim 12, wherein the first-direction plurality of wirings includes, gate wirings spaced apart from each other in the second direction by a gate pitch, and first wirings above the gate wirings spaced apart from each other in the second direction by a first pitch, the gate wirings are below the fourth wirings, the first wirings are above the fourth wirings and placed below the fifth wirings, and a ratio between the gate pitch and the first pitch is 6:4.

14. The semiconductor device of claim 13, wherein the first-direction plurality of wirings further includes second wirings above the first wirings spaced apart from each other in the second direction by a second pitch, the second wirings are above the fifth wirings and below the sixth wirings, and a ratio between the gate pitch, the first pitch, and the second pitch is 6:4:5.

15. The semiconductor device of claim 14, wherein the first-direction plurality of wirings further includes, third wirings above the second wirings spaced apart from each other in the second direction by a third pitch, the third wirings are above the sixth wirings and are below the seventh wirings, and a ratio between the gate pitch, the first pitch, the second pitch, and the third pitch is 6:4:5:9.

16. The semiconductor device of claim 12, wherein the first-direction plurality of wirings includes gate wirings spaced apart from each other in the second direction by a gate pitch, first wirings above the gate wirings spaced apart from each other in the second direction by a first pitch and second wirings on the first wirings spaced apart from each other in the second direction by a second pitch, the gate wirings are below the fourth wirings, the first wirings are above the fourth wirings and below the fifth wirings, the second wirings are above the fifth wirings and below the sixth wirings, and a ratio between the first pitch and the second pitch is 4:5.

17. The semiconductor device of claim 16, wherein the first-direction plurality of wirings further comprises third wirings above the second wirings spaced apart from each other in the second direction by a third pitch, the third wirings are above the sixth wirings and are below the seventh wirings, and a ratio between the first pitch, the second pitch, and the third pitch is 4:5:9.

18. A semiconductor device comprising:

a first-direction plurality of wirings extending in a first direction; and a second-direction plurality of wirings extending in a second direction that intersects the first direction, the first-direction plurality of wirings including, gate wirings spaced apart from each other in the second direction by a gate pitch, first wirings above the gate wirings spaced apart from each other in the second direction by a first pitch, second wirings above the first wirings spaced apart from each other in the second direction by a second pitch, and third wirings above the second wirings spaced apart from each other in the second direction by a third pitch, the second direction plurality of wirings including, fourth wirings above the gate wirings and below the first wirings and spaced apart from each other in the first direction by a fourth pitch and in an interlayer insulating layer, at least one of the fourth wirings directly connected to a gate via that is directly connected to one of the gate wirings, a VDD power supply wiring in the interlayer insulating layer, a VSS power supply wiring in the interlayer insulating layer, fifth wirings above the first wirings and spaced apart from each other in the first direction by a fifth pitch, sixth wirings above the fifth wirings and spaced apart from each other in the first direction by a sixth pitch, and seventh wirings above the sixth wirings and spaced apart from each other in the first direction by a seventh pitch, wherein a first ratio between the gate pitch and the first pitch is 6:4, the first ratio based on a least common multiple of the gate pitch, the first pitch, the second pitch, and the third pitch, a second ratio between the fourth pitch and the fifth pitch is 5:4, the second ratio based on a least common multiple of the fourth pitch, the fifth pitch, the sixth pitch, and the seventh pitch, and the VDD power supply wiring, the VSS power supply wiring, and the fourth wirings are placed at a same level in the semiconductor device, the same level between the gate wirings and the first wirings.

* * * * *